(12) United States Patent
Aoyagi et al.

(10) Patent No.: US 11,680,797 B2
(45) Date of Patent: Jun. 20, 2023

(54) PHYSICAL QUANTITY SENSOR

(71) Applicant: Panasonic Intellectual Property Management Co., Ltd., Osaka (JP)

(72) Inventors: Takanori Aoyagi, Osaka (JP); Hiroyuki Aizawa, Osaka (JP); Chunzhi Dong, Osaka (JP); Shinichi Kishimoto, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 5 days.

(21) Appl. No.: 17/442,269

(22) PCT Filed: Feb. 19, 2020

(86) PCT No.: PCT/JP2020/006639
§ 371 (c)(1),
(2) Date: Sep. 23, 2021

(87) PCT Pub. No.: WO2020/195386
PCT Pub. Date: Oct. 1, 2020

(65) Prior Publication Data
US 2022/0155072 A1     May 19, 2022

(30) Foreign Application Priority Data

Mar. 27, 2019   (JP) .............................. JP2019-061934

(51) Int. Cl.
*G01C 19/56* (2012.01)
*G01P 15/12* (2006.01)
*G01P 15/18* (2013.01)
*G01C 19/574* (2012.01)
*G01P 15/08* (2006.01)

(52) U.S. Cl.
CPC ........... *G01C 19/56* (2013.01); *G01C 19/574* (2013.01); *G01P 15/0802* (2013.01); *G01P 15/123* (2013.01); *G01P 15/18* (2013.01)

(58) Field of Classification Search
CPC .... G01P 15/123; G01P 15/18; G01P 15/0802; G01C 19/56; G01C 19/574;
(Continued)

(56) References Cited

U.S. PATENT DOCUMENTS

2009/0321857 A1* 12/2009 Foster ..................... H01L 29/84
                                                               257/E21.001
2010/0083756 A1    4/2010 Merz et al.
(Continued)

FOREIGN PATENT DOCUMENTS

JP     2010-523954 A     7/2010
JP     2010-256054 A     11/2010
(Continued)

OTHER PUBLICATIONS

International Search Report and Written Opinion issued in International Patent Application No. PCT/JP2020/006639, dated Apr. 7, 2020; with partial English translation.

*Primary Examiner* — Helen C Kwok
(74) *Attorney, Agent, or Firm* — McDermott Will & Emery LLP

(57) ABSTRACT

A physical quantity sensor includes a substrate, an anchor portion, a surrounding portion, a detecting element, a moving portion, and a beam portion. The anchor portion is formed on the same side as a principal surface of the substrate and fixed to the substrate. The surrounding portion is formed on the same side as the principal surface of the substrate and surrounds the anchor portion. The detecting element detects a physical quantity as a target of detection. The moving portion is provided with at least a part of the detecting element, formed on the same side as the principal surface of the substrate, and connected to the surrounding portion. The beam portion is formed on the same side as the (Continued)

principal surface of the substrate and connects the anchor portion and the surrounding portion together.

13 Claims, 19 Drawing Sheets

(58) Field of Classification Search
CPC ............ G01C 19/5712; G01C 19/5719; G01C 19/5642; G01C 19/5747; G01C 19/5769
See application file for complete search history.

(56) References Cited

U.S. PATENT DOCUMENTS

| | | | |
|---|---|---|---|
| 2011/0185829 A1* | 8/2011 | Sugita | G01C 19/5712 74/5.7 |
| 2013/0167636 A1* | 7/2013 | Coronato | G01C 19/5712 73/504.12 |
| 2016/0033275 A1 | 2/2016 | Coronato et al. | |
| 2016/0054353 A1* | 2/2016 | Tanaka | B81C 1/00357 73/514.32 |
| 2018/0340775 A1 | 11/2018 | Kuisma | |
| 2019/0242709 A1* | 8/2019 | Imanaka | B81B 7/0051 |
| 2019/0383612 A1* | 12/2019 | Geisberger | G01C 19/5747 |
| 2021/0215735 A1* | 7/2021 | Tseng | G01P 1/00 |

FOREIGN PATENT DOCUMENTS

| | | |
|---|---|---|
| JP | 2013-145231 A | 7/2013 |
| JP | 6167314 B2 | 7/2017 |
| JP | 2019-023618 A | 2/2019 |
| WO | 2018/135211 A1 | 7/2018 |

* cited by examiner

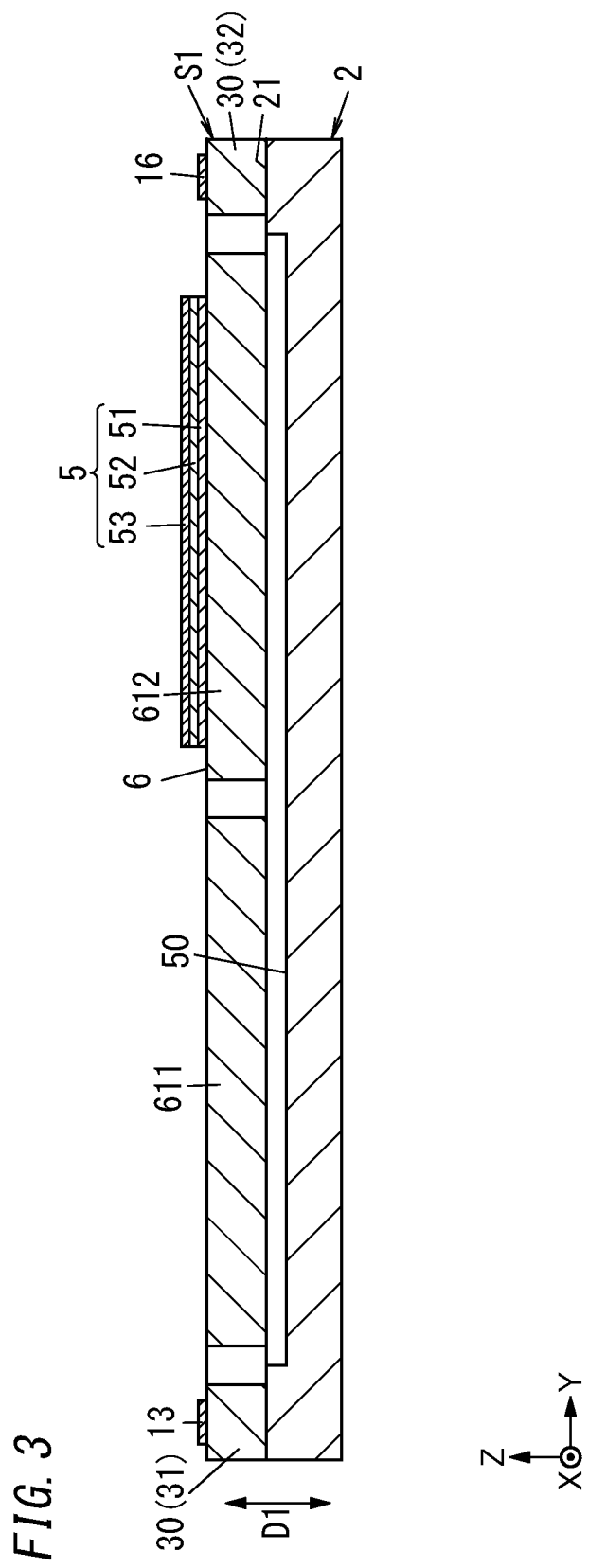

FIG. 14
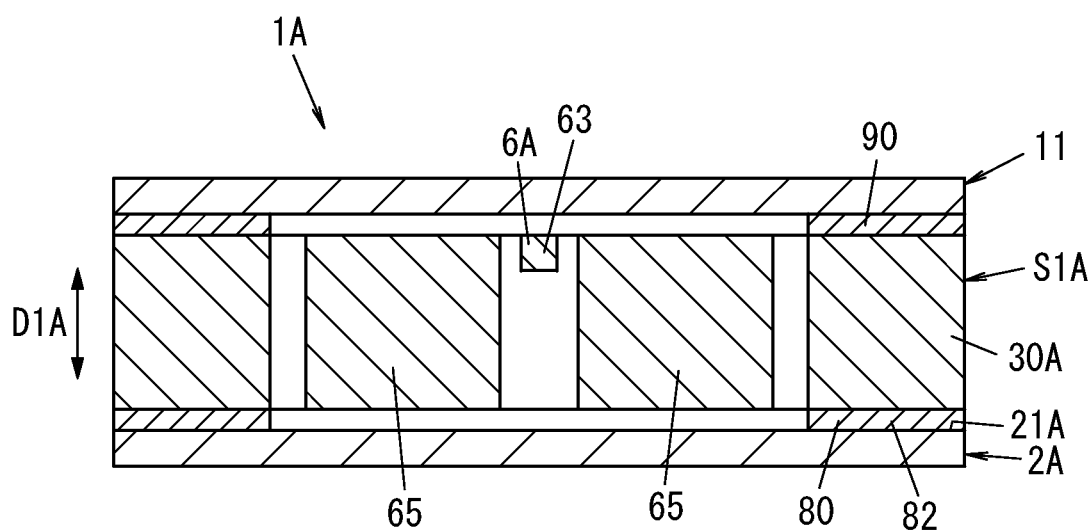
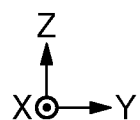

PHYSICAL QUANTITY SENSOR

CROSS-REFERENCE OF RELATED APPLICATIONS

This application is the U.S. National Phase under 35 U.S.C. § 371 of International Patent Application No. PCT/JP2020/006639, filed on Feb. 19, 2020, which in turn claims the benefit of Japanese Application No. 2019-061934, filed on Mar. 27, 2019, the entire disclosures of which Applications are incorporated by reference herein.

TECHNICAL FIELD

The present disclosure generally relates to a physical quantity sensor, and more particularly relates to a physical quantity sensor including an anchor portion and a moving portion.

BACKGROUND ART

Examples of known physical quantity sensors include angular velocity sensors and accelerating sensors, each including an anchor portion and a moving portion.

For example, an angular velocity sensor element, including a pair of fixing portions, a drive arm, a supporting member (substrate), and a weight, has been known in the art as this type of physical quantity sensor (see, for example, Patent Literature 1).

In such a physical quantity sensor, stress is sometimes transmitted from outside of the sensor to the moving portion via the substrate to cause a variation in the sensor characteristic. In addition, when the physical quantity sensor is used to be either encapsulated in a package or mounted on a circuit board, stress is sometimes transmitted from either the package or the circuit board to the moving portion via the fixed portion due to a difference in coefficient of linear expansion between the physical quantity sensor and the package or the circuit board, thus causing a variation in the sensor characteristic.

CITATION LIST

Patent Literature

Patent Literature 1: JP 2010-256054 A

SUMMARY OF INVENTION

An object of the present disclosure is to provide a physical quantity sensor with the ability to reduce such a variation in sensor characteristic.

A physical quantity sensor according to an aspect of the present disclosure includes a substrate, an anchor portion, a surrounding portion, a detecting element, a moving portion, and a beam portion. The anchor portion is formed on the same side as a principal surface of the substrate and fixed to the substrate. The surrounding portion is formed on the same side as the principal surface of the substrate and surrounds the anchor portion. The detecting element detects a physical quantity as a target of detection. The moving portion is provided with at least a part of the detecting element, formed on the same side as the principal surface of the substrate, and connected to the surrounding portion. The beam portion is formed on the same side as the principal surface of the substrate and connects the anchor portion and the surrounding portion together.

BRIEF DESCRIPTION OF DRAWINGS

FIG. 3 is a cross-sectional view, taken along the plane A-A shown in FIG. 2, of the physical quantity sensor;

FIG. 14 is a cross-sectional view, taken along the plane A-A shown in FIG. 13, of the physical quantity sensor;

DESCRIPTION OF EMBODIMENTS

Figure 1:
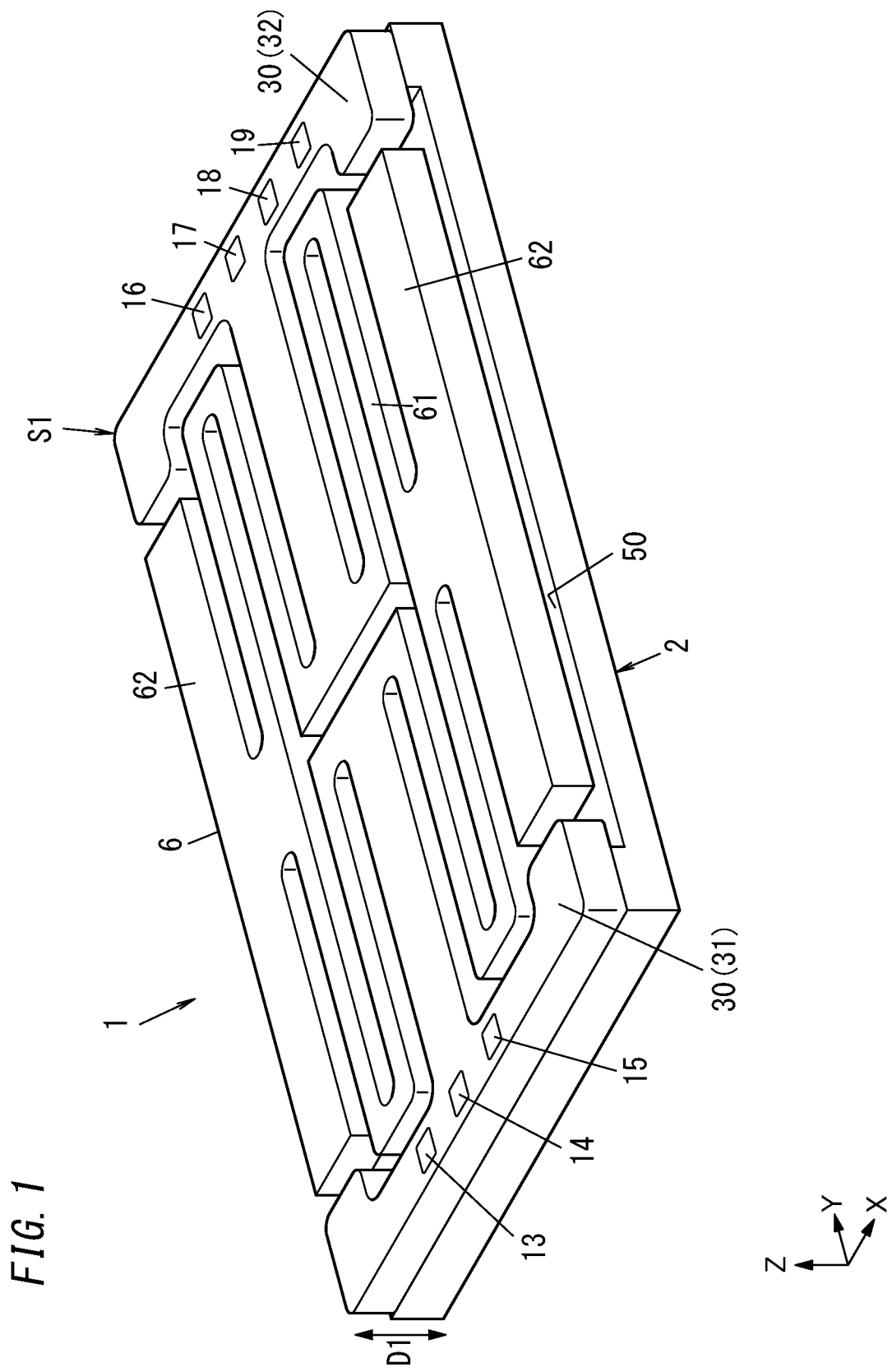
FIG. 1 is a perspective view of a physical quantity sensor according to a first embodiment.

Note that the drawings to be referred to in the following description of embodiments are all schematic representations. Thus, the ratio of the dimensions (including thicknesses) of respective constituent elements illustrated on the drawings does not always reflect their actual ratio.

First Embodiment

A physical quantity sensor 1 according to a first embodiment will now be described with reference to FIGS. 1-7.

(1.1) Overview

A physical quantity sensor 1 according to a first exemplary embodiment includes a substrate 2, an anchor portion 3 (see FIGS. 4A and 4B), a surrounding portion 4 (see FIGS. 4A and 4B), detecting elements 5 (see FIGS. 2 and 3), a moving portion 6, and beam portions 7 (see FIGS. 4A and 4B) as shown in FIGS. 1-5. Note that illustration of the substrate 2 is omitted in FIGS. 2, 6, and 7.

The anchor portion 3 is formed on the same side as the principal surface 21 of the substrate 2 and fixed to the substrate 2. The surrounding portion 4 is formed on the same side as the principal surface 21 of the substrate 2 and surrounds the anchor portion 3. The detecting element 5 detects a physical quantity as a target of detection. The moving portion 6 is provided with at least a part of the detecting element 5, formed on the same side as the principal surface 21 of the substrate 2, and connected to the surrounding portion 4. The beam portions 7 are formed on the same side as the principal surface 21 of the substrate 2 and connect the anchor portion 3 and the surrounding portion 4 together. As used herein, the principal surface 21 of the substrate 2 refers to one surface thereof, formed on the same side as the anchor portion 3, out of the two surfaces of the substrate 2 which intersect with the thickness direction D1 defined with respect to the substrate 2.

The physical quantity sensor 1 according to the first embodiment is designed to detect an angular velocity as its target physical quantity. Therefore, the physical quantity sensor 1 according to the first embodiment is an angular velocity sensor.

The physical quantity sensor 1 according to the first embodiment transduces, for example, an angular velocity into an electrical signal. That is to say, the physical quantity sensor 1 according to the first embodiment serves as a transducer for transducing an angular velocity into an electrical signal. The physical quantity sensor 1 is applicable for use in, for example, consumer electronic appliances, mobile telecommunications devices, cameras, wearable terminals, game consoles, vehicles (including automobiles and two-wheeled vehicles), robots, construction machines, drones, aircrafts, and watercrafts.

Figure 2:
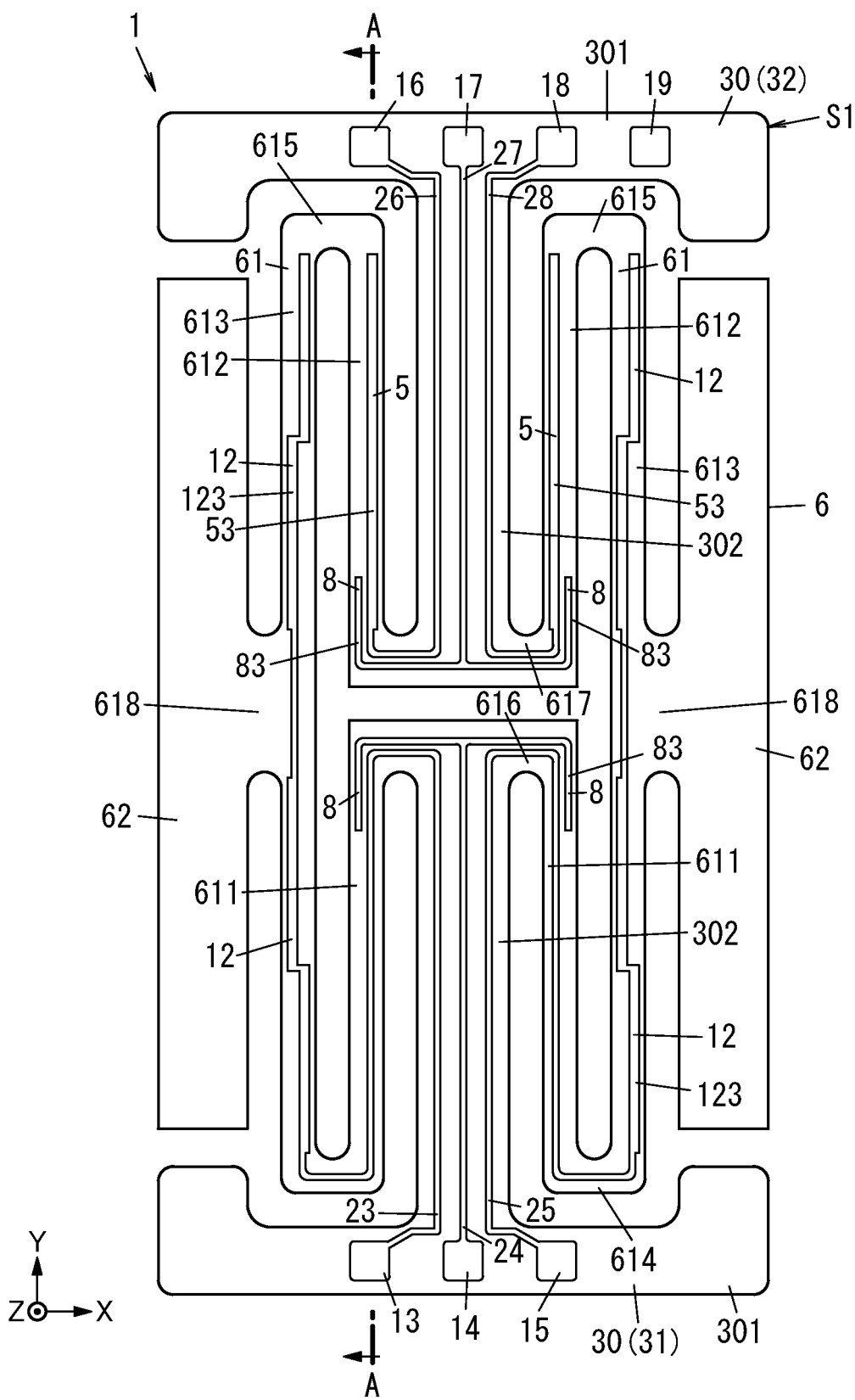
FIG. 2 is a plan view of the physical quantity sensor.

In the physical quantity sensor 1 according to the first embodiment, the moving portion 6 includes drive arms 61 and weights 62 as shown in FIGS. 1 and 2. In addition, the physical quantity sensor 1 according to the first embodiment further includes drive elements 12 (see FIG. 2) for driving the drive arms 61. The drive elements 12 are each provided for an associated drive arm 61 of the moving portion 6. The drive elements 12 are piezoelectric elements (hereinafter referred to as "first piezoelectric elements"). The detecting elements 5 are provided for the drive arms 61 of the moving portion 6. The detecting elements 5 are piezoelectric elements (hereinafter referred to as "second piezoelectric elements"). The detecting elements 5 each output an electrical signal representing Coriolis force corresponding to the angular velocity.

(1.2) Details

A configuration for the physical quantity sensor 1 according to the first embodiment will be described in detail with reference to FIGS. 1-5.

In the following description, an orthogonal coordinate system with three axes that intersect with each other at right angles (namely, an X-axis, a Y-axis, and a Z-axis) is defined. Particularly, the "Z-axis" is supposed to be an axis aligned with the thickness direction D1 defined with respect to the substrate 2, the "X-axis" is supposed to be an axis aligned with a direction in which the weights 62 are caused to vibrate, and the "Y-axis" is supposed to be an axis that intersects with both the Z- and X-axes at right angles. Note that each of the X-, Y-, and Z-axes is a virtual axis and the arrows indicating X, Y, and Z on the drawings are shown there just for the sake of convenience of description and are all insubstantial ones. In addition, these arrows should not be construed as limiting the directions in which the physical quantity sensor 1 is supposed to be used.

The physical quantity sensor 1 according to the first embodiment may be designed to detect, for example, an angular velocity around the Z-axis as its target of detection. The Z-axis is an axis aligned with the thickness direction D1 defined with respect to the substrate 2. Consequently, the physical quantity sensor 1 outputs an electrical signal representing an angular velocity around a center axis (i.e., around the Z-axis) aligned with the thickness direction D1 defined with respect to the substrate 2. This enables measuring, based on the output of the physical quantity sensor 1, the magnitude of the angular velocity around the center axis of the substrate 2 (i.e., around the Z-axis).

(1.2.1) Overall Configuration of Physical Quantity Sensor

Figure 4A:
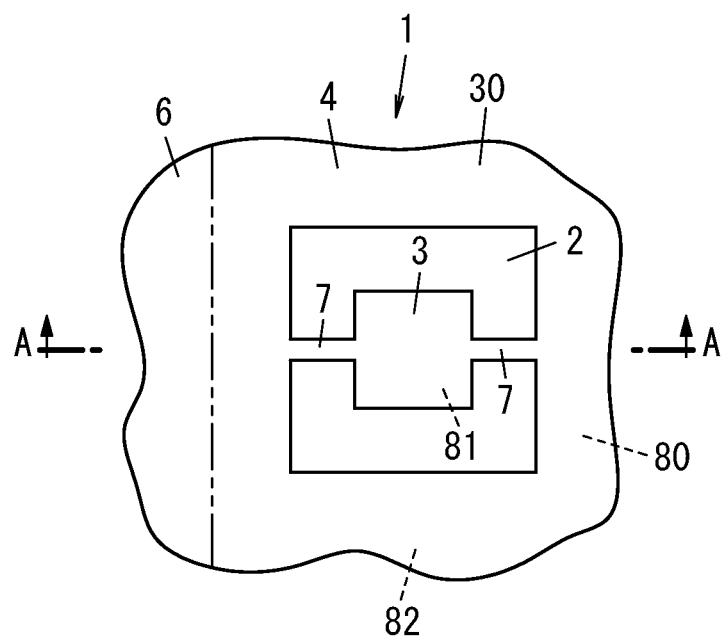
FIG. 4A is a plan view of a principal part of the physical quantity sensor.
Figure 4B:
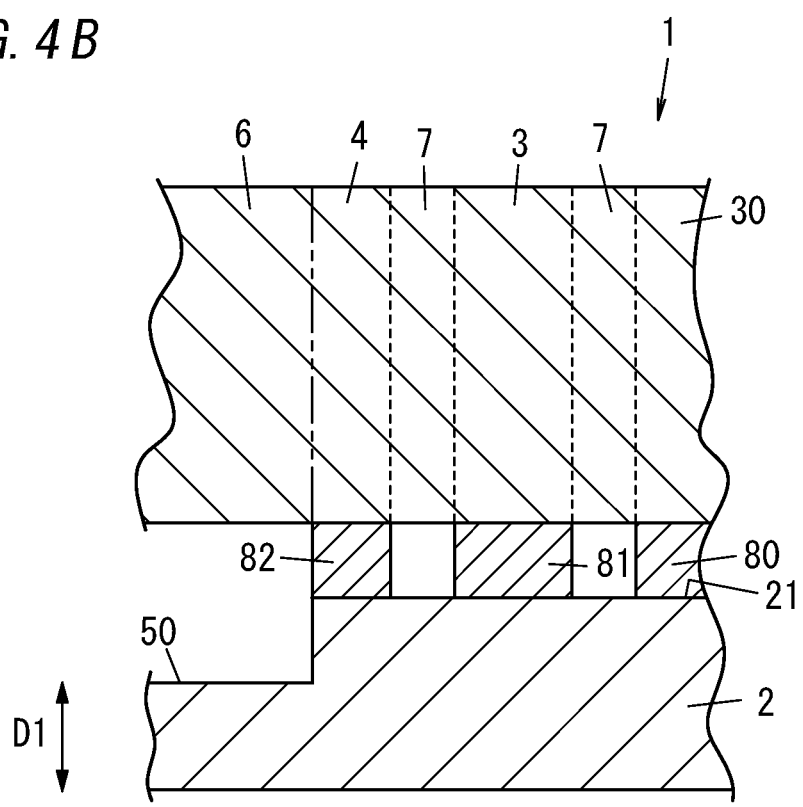
FIG. 4B is a cross-sectional view thereof taken along the plane A-A shown in FIG. 4A.

The physical quantity sensor 1 according to the first embodiment includes a substrate 2, supporting portions 30, detecting elements 5 (see FIGS. 2 and 3), and a moving portion 6 as shown in FIG. 1. Each of the supporting portions 30 includes an anchor portion 3, a surrounding portion 4, and beam portions 7 as shown in FIGS. 4A and 4B. The moving portion 6 includes drive arms 61 and weights 62 as shown in FIGS. 1 and 2. In addition, the physical quantity sensor 1 further includes drive elements 12 (see FIG. 2).

The physical quantity to be detected by the physical quantity sensor 1 according to the first embodiment is an angular velocity around the Z-axis (i.e., a center axis aligned with the thickness direction D1 defined with respect to the substrate 2). Thus, the physical quantity sensor 1 outputs an electrical signal representing the angular velocity around the Z-axis. The physical quantity sensor 1 is a vibration type gyrosensor and configured to detect an angular velocity around the Z-axis by using the Coriolis force (deflecting force). That is to say, the physical quantity sensor 1 detects the angular velocity applied to the drive arms 61 of the physical quantity sensor 1 by detecting the Coriolis force produced upon the application of external rotational force to the drive arms 61 (and the weights 62) with the drive arms 61 (and the weights 62) allowed to vibrate (see FIG. 6).

When viewed in plan in the thickness direction D1 defined with respect to the substrate 2, the substrate 2 has a rectangular outer peripheral shape. The substrate 2 may be a silicon substrate, for example. The substrate 2 has been cut out of a silicon wafer. However, the substrate 2 does not have to be a silicon substrate but may also be a glass substrate, for example. When a glass substrate is used as the substrate 2, borosilicate glass, of which the coefficient of linear expansion is not significantly different from that of silicon, is suitably used.

In the physical quantity sensor 1 according to the first embodiment, a structure S1 including the supporting portions 30 and the moving portion 6 may be formed by, for example, machining a silicon wafer by microelectromechanical systems (MEMS) manufacturing technology. Therefore, the material for the structure S1 includes silicon. The supporting portions 30 include the anchor portion 3, the surrounding portion 4, and the beam portions 7 as described above.

The physical quantity sensor 1 according to the first embodiment includes two supporting portions 30 as shown in FIGS. 1-3. In this embodiment, the two supporting portions 30 are formed on the same side as the principal surface 21 of the substrate 2. In the physical quantity sensor 1 according to the first embodiment, the anchor portion 3 and surrounding portion 4 of each supporting portion 30 are fixed to the substrate 2. In the physical quantity sensor 1 according to the first embodiment, the beam portions 7 of each supporting portion 30 are not fixed to the substrate 2.

The two supporting portions 30 are spaced apart from each other, and face each other, in the Y-axis direction. Each supporting portion 30 has an elongate shape when viewed in plan in the thickness direction D1 defined with respect to the substrate 2 (see FIG. 2). Each of the two supporting portions 30 is an elongate base portion 301 arranged along a shorter side of the substrate 2. On the other hand, the moving portion 6 includes extended portions 302, each of which is extended from a longitudinal middle portion of one supporting portion 30 (base portion 301) toward the other supporting portion 30. The supporting portions 30 are arranged in the X-axis direction and the extended portions 302 are arranged in the Y-axis direction. In the following description, when the two supporting portions 30 need to be distinguished from each other, one supporting portion 30, which is illustrated as the lower one in FIG. 2, out of the two supporting portions 30 will be hereinafter sometimes referred to as a "first supporting portion 31" and the other supporting portion 30, which is illustrated as the upper one in FIG. 2, out of the two supporting portions 30 will be hereinafter sometimes referred to as a "second supporting portion 32."

The moving portion 6 of the physical quantity sensor 1 according to the first embodiment includes two drive arms 61 and two weights 62. Each of the two drive arms 61 has a C-shape when viewed in plan in the thickness direction D1 defined with respect to the substrate 2 (see FIG. 2). One end of each of the two drive arms 61 is connected to a tip of the extended portion 302 extended from the first supporting portion 31, while the other end of each of the two drive arms 61 is connected to a tip of the extended portion 302 extended from the second supporting portion 32.

As shown in FIG. 2, each of the two drive arms 61 includes a first moving piece 611, second moving piece 612, a first coupling piece 616, a second coupling piece 617, a driving piece 613, a first bent portion 614, a second bent portion 615, and a third coupling piece 618. The first moving piece 611 faces, in the X-axis direction, the extended portion 302 extended from the first supporting portion 31. The first coupling piece 616 connects the tip of the extended portion 302 extended from the first supporting portion 31 to one end of the first moving piece 611. The second moving piece 612 faces, in the X-axis direction, the extended portion 302 extended from the second supporting portion 32. The second coupling piece 617 connects the tip of the extended portion 302 extended from the second supporting portion 32 to one end of the second moving piece 612. The driving piece 613 faces, in the X-axis direction, the first moving piece 611 and the second moving piece 612. The first bent portion 614 connects the other end of the first moving piece 611 to one end, facing the first supporting portion 31, of the driving piece 613. The second bent portion 615 connects the other end of the second moving piece 612 to the other end, facing the second supporting portion 32, of the driving piece 613. The third coupling piece 618 connects the driving piece 613 to the weight 62.

Each of the two weights 62 faces, in the X-axis direction, the driving piece 613 of an associated one of the two drive arms 61 and has a longitudinal middle portion thereof connected to a longitudinal middle portion of the driving piece 613 via the third coupling piece 618.

The physical quantity sensor 1 according to the first embodiment includes two detecting elements 5 (see FIGS. 2 and 3). Each of the two detecting elements 5 is provided on the second moving piece 612 facing the extended portion 302 extended from the second supporting portion 32 in an associated one of the two drive arms 61. Each of the two detecting elements 5 is a piezoelectric element as described above and may include, for example, a lower electrode 51 provided on the second moving piece 612, a piezoelectric layer 52 provided on the lower electrode 51, and an upper electrode 53 provided on the piezoelectric layer 52. The material for the lower electrode 51 may be platinum, for example. The material for the piezoelectric layer 52 may be lead zirconate titanate (PZT), for example. The material for the upper electrode 53 may be gold, for example. Note that these materials for the lower electrode 51, the piezoelectric layer 52, and the upper electrode 53 are only examples and should not be construed as limiting.

In addition, the physical quantity sensor 1 further includes four monitor elements 8 (see FIG. 2). Two monitor elements 8 are provided for each of the two drive arms 61. In each of the two drive arms 61, one of the two monitor elements 8 is provided on the first moving piece 611 and the other monitor element 8 is provided on the second moving piece 612. Each monitor element 8 has the same multilayer structure as each of the piezoelectric elements serving as the detecting elements 5. That is to say, each monitor element 8 includes: a lower electrode provided on the second moving piece 612; a piezoelectric layer provided on the lower electrode; and an upper electrode 83 provided on the piezoelectric layer.

The physical quantity sensor 1 according to the first embodiment further includes four external connection electrodes 16-19 provided on the second supporting portion 32. The four external connection electrodes 16-19 are arranged side by side in the X-axis direction on the second supporting portion 32.

In addition, the physical quantity sensor 1 further includes: a wiring portion 26 that electrically connects the upper electrode 53 of the left one 5 of the two detecting elements 5 shown in FIG. 2 to the external connection electrode 16; and a wiring portion 28 that electrically connects the upper electrode 53 of the right detecting element 5 to the external connection electrode 18. Moreover, the physical quantity sensor 1 further includes a wiring portion 27 that electrically connects the respective upper electrodes 83 of the monitor elements 8 on the two second moving pieces 612 to the external connection electrode 17 (monitor electrode). The physical quantity sensor 1 further includes a wiring portion that electrically connects the respective lower electrodes 51 of the two detecting elements 5 to the external connection electrode 19 (ground electrode).

The physical quantity sensor 1 according to the first embodiment includes four drive elements 12. Two drive elements 12 are provided on the driving piece 613, facing one of the weights 62, of one of the two drive arms 61. The other two drive elements 12 are provided on the driving piece 613, facing the other weight 62, of the other drive arm 61. One drive element 12 out of the two drive elements 12 provided on the driving piece 613 is arranged on a part, facing the first moving piece 611, of the driving piece 613. The other drive element 12 is arranged on a part, facing the second moving piece 612, of the driving piece 613. Each of the four drive elements 12 has a crank shape when viewed in plan in the thickness direction D1 defined with respect to the substrate 2.

Each of the four drive elements 12 is a piezoelectric element as described above, and may include, for example, a lower electrode provided on the driving piece 613, a piezoelectric layer provided on the lower electrode, and an upper electrode 123 provided on the piezoelectric layer.

The physical quantity sensor 1 according to the first embodiment further includes three external connection electrodes 13-15 provided on the first supporting portion 31. The three external connection electrodes 13-15 are arranged side by side in the X-axis direction on the first supporting portion 31.

In addition, the physical quantity sensor 1 further includes: a wiring portion 23 that electrically connects the respective upper electrodes 123 of the left pair of drive elements 12 shown in FIG. 2 to the external connection electrode 13; and a wiring portion 25 that electrically connects the respective upper electrodes 123 of the right pair of drive elements 12 to the external connection electrode 15. Moreover, the physical quantity sensor 1 further includes a wiring portion 24 that electrically connects the respective upper electrodes 83 of the monitor elements 8 on the two first moving pieces 611 to the external connection electrode 14 (monitor electrode). The physical quantity sensor 1 further includes a wiring portion that electrically connects the respective lower electrodes of the drive elements 12 to the external connection electrode 19 (ground electrode) on the second supporting portion 32.

Furthermore, as shown in FIG. 3, the principal surface 21 of the substrate 2 has a recess 50. The recess 50 is provided not to overlap with the first supporting portion 31 or the second supporting portion 32 but to overlap with the moving portion 6 when viewed in plan in the thickness direction D1 defined with respect to the substrate 2. This brings the moving portion 6 out of contact with of the substrate 2 in the thickness direction D1 defined with respect to the substrate 2. The recess 50 may have a rectangular shape when viewed in plan in the thickness direction D1 defined with respect to the substrate 2. However, this is only an example of the present disclosure and should not be construed as limiting. Alternatively, the recess 50 may also have an H-shape, for example, in a plan view.

The physical quantity sensor 1 further includes a bonding portion 80 interposed between the substrate 2 and each supporting portion 30. In this embodiment, the bonding portion 80 is interposed between the substrate 2 and the anchor portion 3 and surrounding portion 4 of the supporting portion 30 as shown in FIG. 4B. The bonding portion 80 includes a first bonding portion 81 interposed between the substrate 2 and the anchor portion 3 and a second bonding portion 82 interposed between the substrate 2 and the surrounding portion 4. The bonding portion 80 may be bonded as, for example, a resin layer. However, the bonding portion 80 does not have to be a resin layer but may also be a silicon dioxide layer, a metal layer, or a eutectic metal layer, for example.

Figure 5:
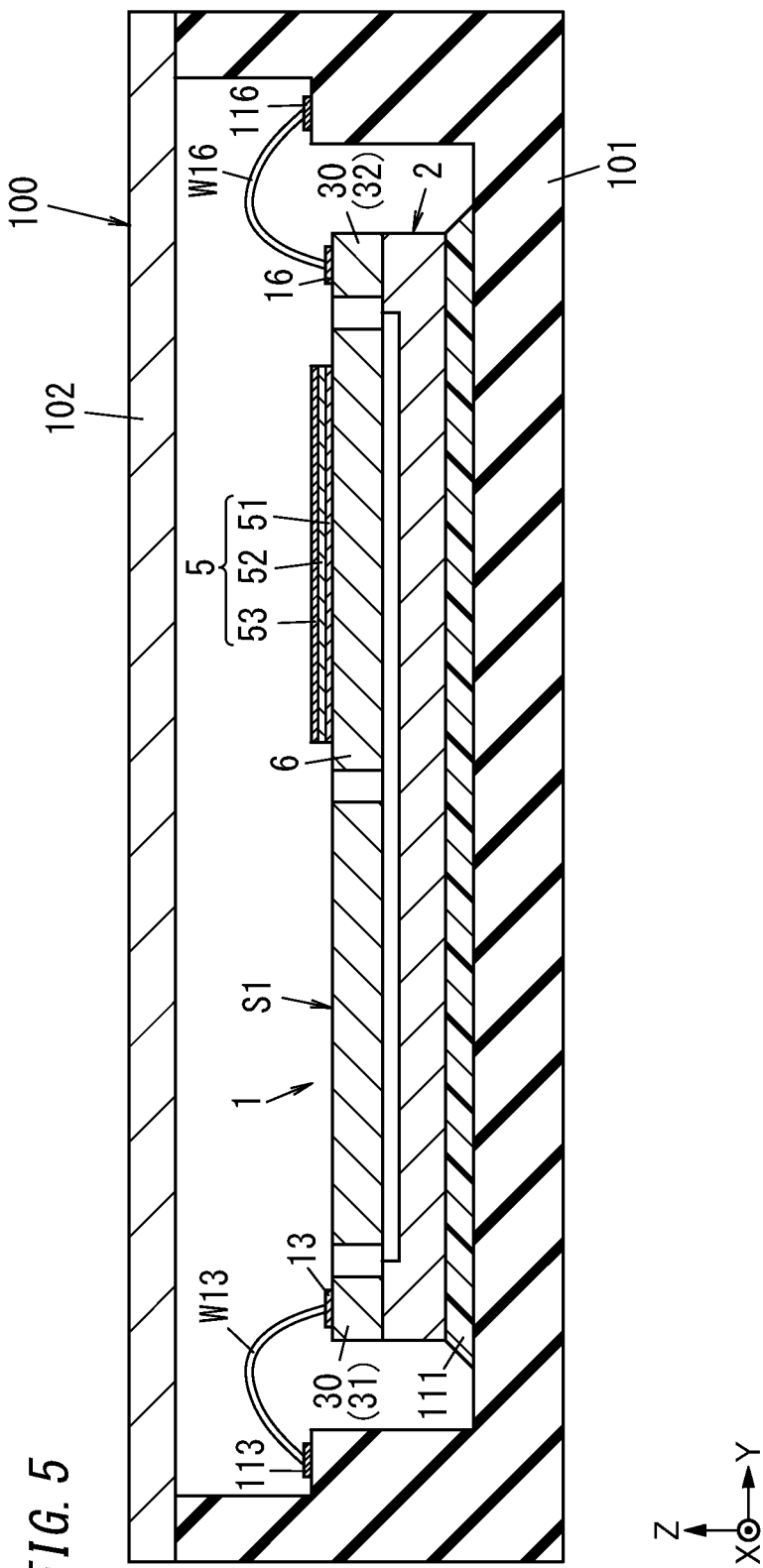
FIG. 5 is a cross-sectional view of a sensor device including the physical quantity sensor and a package.

The physical quantity sensor 1 is used to be housed in a package 100, for example, as shown in FIG. 5. The package 100 includes a package body 101 and a package lid 102. The package body 101 has the shape of a box, of which one surface has an opening. The package lid 102 is bonded to the package body 101 so as to close the opening of the package body 101. The package body 101 may be a ceramic package body or a plastic package body, whichever is appropriate. Examples of materials for the package lid 102 include metals and stainless steel. In a sensor device including the physical quantity sensor 1 and the package 100, the physical quantity sensor 1 is bonded (die-bonded) to the package body 101 via a bonding portion 111, for example. Examples of materials for the bonding portion 111 include a silicone-based resin and an epoxy-based resin. In addition, the plurality of external connection electrodes 13-19 of the physical quantity sensor 1 and a plurality of conductor portions of the package body 101 are electrically connected via bonding wires. In FIG. 5, two bonding wires W13, W16 which electrically connect two external connection electrodes 13, 16 out of the plurality of external connection electrodes 13-19 one to one to two conductor portions 113, 116 of the package body 101 are shown. Note that if the package body 101 is a plus package body, the conductor portions are inner lead portions of the lead terminals.

The internal space of the package 100 in the sensor device may be either a nitrogen gas atmosphere or a reduced pressure atmosphere (vacuum) and the space between the moving portion 6 and the substrate 2 may also be a nitrogen gas atmosphere or a reduced pressure atmosphere (vacuum). The physical quantity sensor 1 does not have to be used to be mounted on the package body 101 but may also be used to be mounted on a printed wiring board, for example.

(1.2.2) Operation of Physical Quantity Sensor

The physical quantity sensor 1 according to the first embodiment detects an angular velocity around the Z-axis by using the Coriolis force (deflecting force) applied to the weights 62 while the weights 62 are being vibrated in the X-axis direction, for example.

Figure 6:
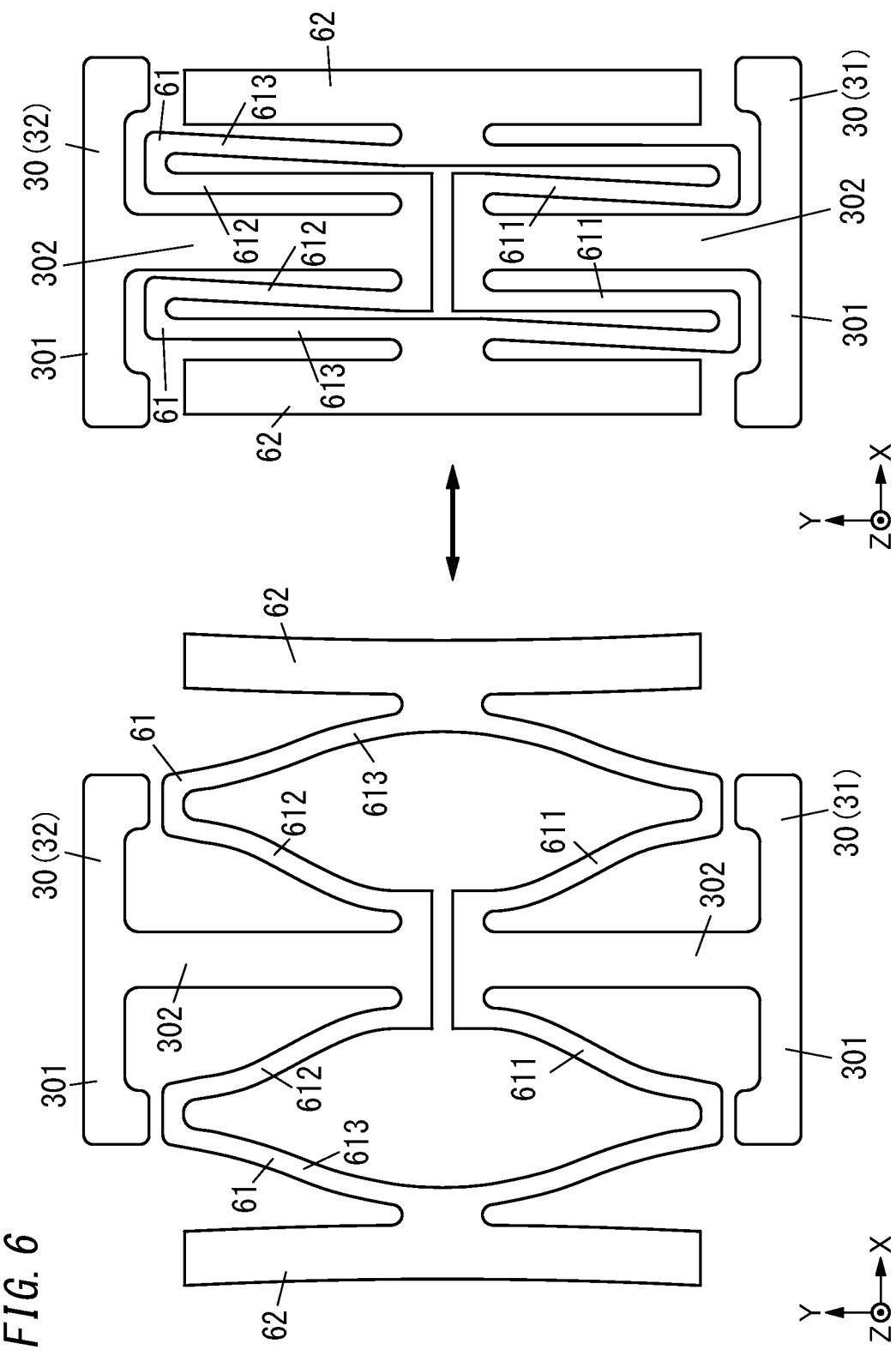
FIG. 6 illustrates how the physical quantity sensor may operate.

In the physical quantity sensor 1, if the potential of the upper electrode 123 is higher than the potential of the lower electrode when an AC voltage for driving is applied from a drive circuit, for example, to the drive elements 12, a tensile stress is produced in the piezoelectric layer. On the other hand, if the potential of the upper electrode 123 is lower than the potential of the lower electrode, then a compressive stress is produced in the piezoelectric layer. Therefore, in the physical quantity sensor 1, the pair of drive arms 61 and the pair of weights 62 vibrate in the X-axis direction as shown in FIG. 6 according to the phase of the AC voltage. This physical quantity sensor 1 may cause the two weights 62 to vibrate in anti-phase and in synch with each other.

Figure 7:
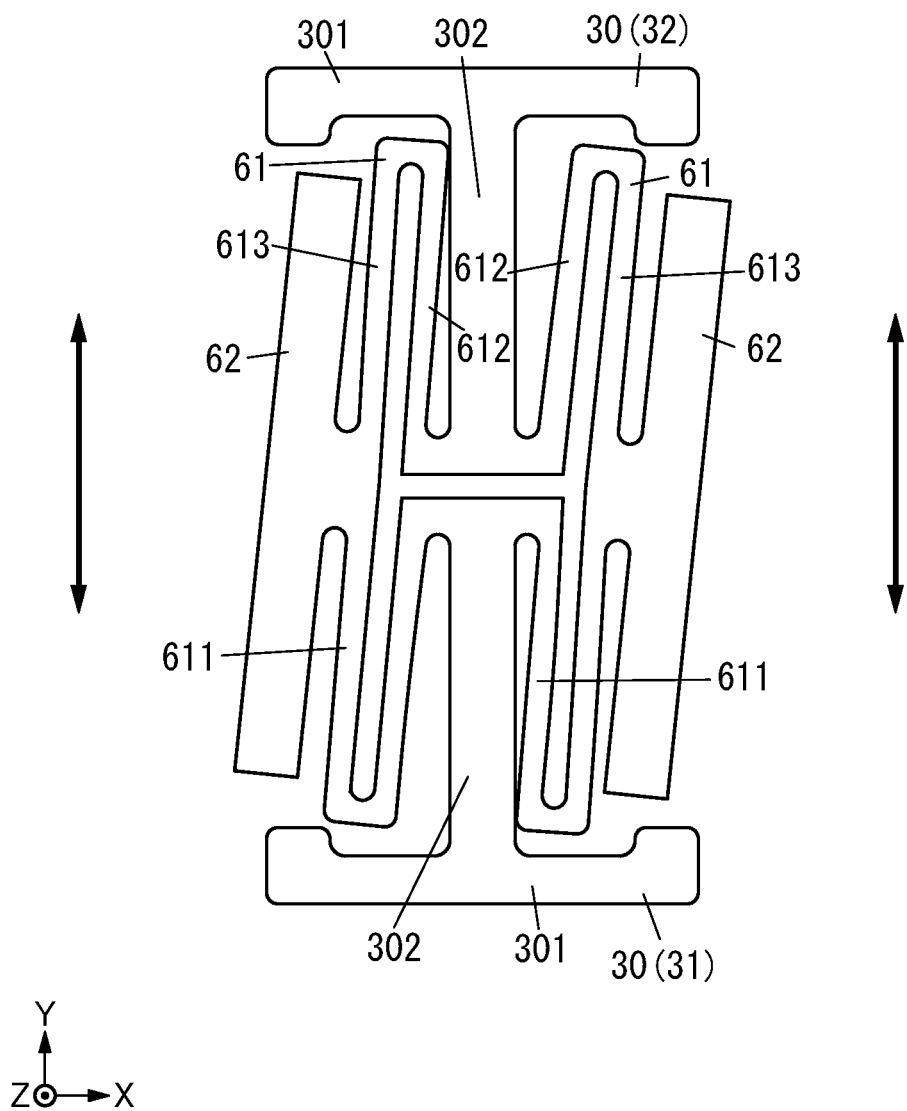
FIG. 7 illustrates how the physical quantity sensor may also operate.

When an angular velocity around the Z-axis is applied to the weights 62 while the two weights 62 are vibrating in the X-axis direction, the Coriolis force (deflecting force) is applied to the weights 62, thus producing vibrations in the Y-axis direction in the weights 62 and thereby causing each of the pair of drive arms 61 to vibrate in the Y-axis direction as indicated by the arrows in FIG. 7. Thus, in this physical quantity sensor 1, an electrical signal is output in accordance with the angular velocity from the detecting elements 5.

The physical quantity sensor 1 may be used, for example, to be electrically connected to a signal processing device. The signal processing device may be, for example, an application specific integrated circuit (ASIC). The signal processing device includes a drive circuit and a processing circuit. The drive circuit provides a voltage signal for driving to the physical quantity sensor 1. The processing circuit performs signal processing on an electrical signal provided by the detecting elements 5 of the physical quantity sensor 1. The processing circuit may obtain an angular velocity around the Z-axis by, for example, converting an analog electrical signal (analog signal) provided by the detecting elements 5 of the physical quantity sensor 1 into a digital signal and performing appropriate arithmetic processing on the digital signal. Optionally, in the sensor device described above, the physical quantity sensor 1 and the ASIC may be housed in the same package 100.

(1.2.3) Details of Anchor Portion and Beam Portions of Physical Quantity Sensor

In the physical quantity sensor 1 according to the first embodiment, the anchor portion 3 and the surrounding portion 4 are connected via the beam portions 7 as shown in FIGS. 4A and 4B. Thus, the physical quantity sensor 1 has a space surrounded with the anchor portion 3, the surrounding portion 4, and the beam portions 7, thus allowing reducing the bonding area between the supporting portions 30 and the substrate 2. In the physical quantity sensor 1 according to the first embodiment, the anchor portion 3 is formed by a part of each of the two supporting portions 30.

In the physical quantity sensor 1 according to the first embodiment, the anchor portion 3 has a square shape when viewed in plan in the thickness direction D1 defined with respect to the substrate 2. In addition, in the physical quantity sensor 1 according to the first embodiment, each of the two beam portions 7 has a linear shape when viewed in plan in the thickness direction D1 defined with respect to the substrate 2. In the physical quantity sensor 1 according to the first embodiment, the two beam portions 7 are arranged in straight line with the center of the anchor portion 3 interposed between them when viewed in plan in the thickness direction D1 defined with respect to the substrate 2.

In the physical quantity sensor 1 according to the first embodiment, the anchor portion 3, the surrounding portion 4, and the beam portions 7 have the same dimension when measured in the thickness direction D1 defined with respect to the substrate 2. In the physical quantity sensor 1 according to the first embodiment, the respective surfaces, opposite from the substrate 2, of the anchor portion 3, the surrounding portion 4, and the beam portions 7, for example, may be flush with each other. In addition, in the physical quantity sensor 1 according to the first embodiment, the beam portions 7 are integrated with the anchor portion 3 and the surrounding portion 4. Furthermore, in the physical quantity sensor 1 according to the first embodiment, the surrounding portion 4 is integrated with the moving portion 6. Note that the respective dimensions of the anchor portion 3 and the beam portions 7 as measured in the thickness direction D1 defined with respect to the substrate 2 may fall, for example, within the range from a few μm to several hundred μm. In addition, the beam portions 7 may have a width falling, for example, within the range from a few μm to several ten μm when viewed in plan in the thickness direction D1 defined with respect to the substrate 2.

Furthermore, in the physical quantity sensor 1 according to the first embodiment, the surrounding portion 4 is fixed to the substrate 2. The physical quantity sensor 1 according to the first embodiment includes: the first bonding portion 81 interposed between the substrate 2 and the anchor portion 3; and the second bonding portion 82 interposed between the substrate 2 and the surrounding portion 4. The first bonding portion 81 and the second bonding portion 82 are spaced apart from each other along the principal surface 21 of the substrate 2. In addition, a gap is left between each of the two beam portions 7 and the principal surface 21 of the substrate 2. Furthermore, in each of the two beam portions 7, the rigidity in the width direction defined with respect to the beam portion 7 (i.e., as measured in the upward/downward direction in FIG. 4A) is lower than the rigidity in the length direction defined with respect to the beam portion 7 (i.e., as measured in the rightward/leftward direction in FIG. 4A) and the rigidity in the thickness direction D1 defined with respect to the substrate 2 (see FIG. 4B). This allows each of the two beam portions 7 to serve as a spring which is elastically deformable in the width direction.

In the physical quantity sensor 1 according to the first embodiment, the two beam portions 7 are connected to the anchor portion 3. In the structure made up of the anchor portion 3 and the two beam portions 7 when viewed in plan in the thickness direction D1 defined with respect to the substrate 2, the two beam portions 7 are arranged to have rotational symmetry around the center axis of the anchor portion 3 when viewed in plan in the thickness direction D1 defined with respect to the substrate 2.

(1.3) Advantages

A physical quantity sensor 1 according to the first embodiment includes a substrate 2, an anchor portion 3, a surrounding portion 4, detecting elements 5, a moving portion 6, and beam portions 7. The anchor portion 3 is formed on the same side as a principal surface 21 of the substrate 2 and fixed to the substrate 2. The surrounding portion 4 is formed on the same side as the principal surface 21 of the substrate 2 and surrounds the anchor portion 3. The detecting elements 5 detect a physical quantity as a target of detection. The moving portion 6 is provided with at least a part of the detecting elements 5, formed on the same side as the principal surface 21 of the substrate 2, and connected to the surrounding portion 4. The beam portions 7 are formed on the same side as the principal surface 21 of the substrate 2 and connect the anchor portion 3 and the surrounding portion 4 together. This allows the physical quantity sensor 1 according to the first embodiment to reduce the chances of external stress transmitted from the substrate 2 to the anchor portion 3 being further transmitted to the moving portion 6, thus enabling reducing a variation in sensor characteristic. In addition, the physical quantity sensor 1 according to the first embodiment may also improve, for example, the temperature characteristic of an offset voltage by reducing the transmission of the stress to the moving portion 6 and the detecting elements 5. Thus, the physical quantity sensor 1 according to the first embodiment may reduce a variation in sensor characteristic due to temperature variations.

First Variation of First Embodiment

Figure 8A:
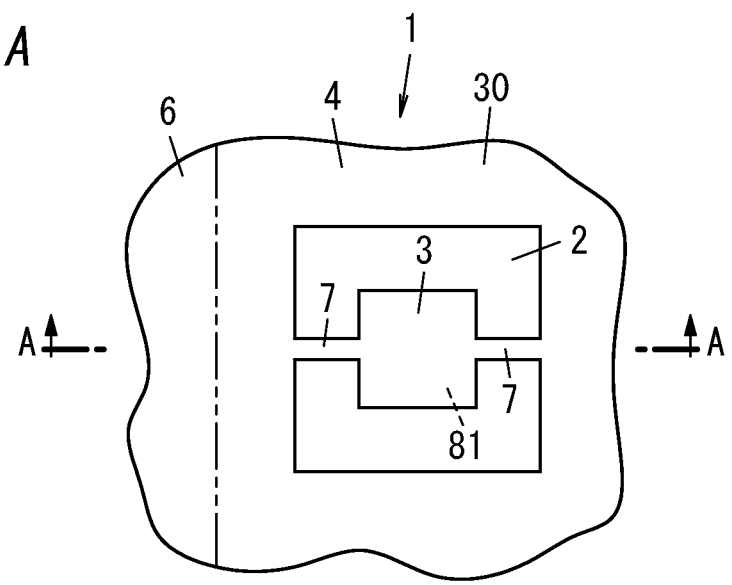
FIG. 8A is a plan view illustrating a principal part of a physical quantity sensor according to a first variation of the first embodiment.
Figure 8B:
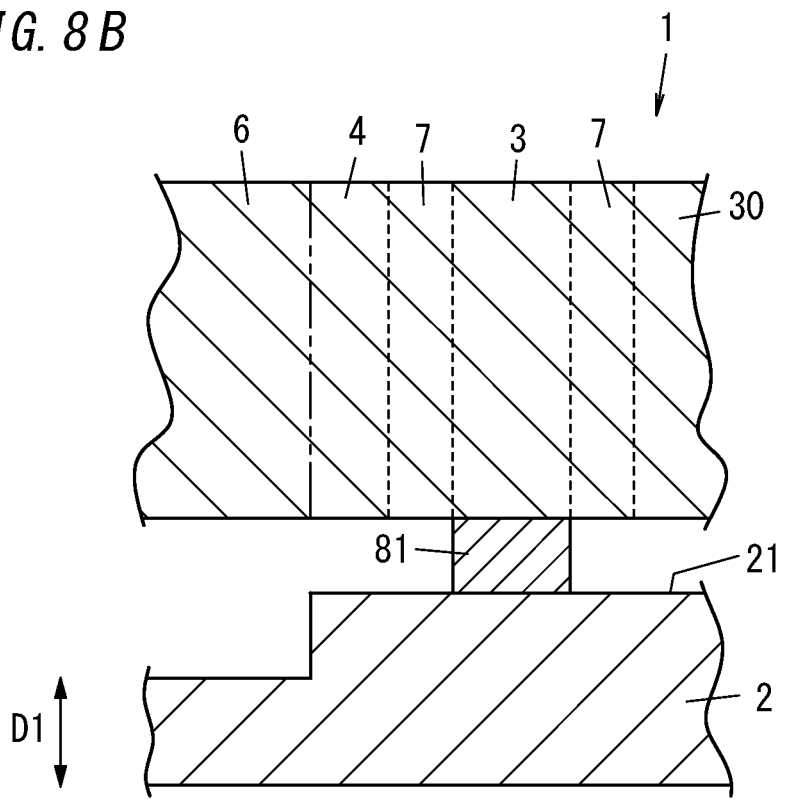
FIG. 8B is a cross-sectional view thereof taken along the plane A-A shown in FIG. 8A.

In a physical quantity sensor 1 according to a first variation, the surrounding portion 4 is not fixed to the substrate 2 as shown in FIGS. 8A and 8B, which is a major difference from the physical quantity sensor 1 according to the first embodiment. The physical quantity sensor 1 according to the first variation may further reduce the transmission of the stress from the substrate 2 to the moving portion 6 and the detecting elements 5, compared to the physical quantity sensor 1 according to the first embodiment.

Second Variation of First Embodiment

Figure 9A:
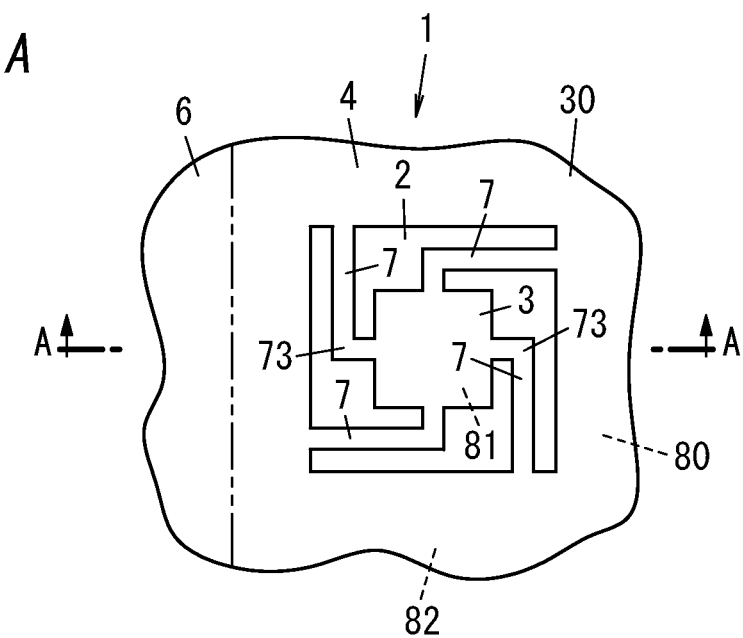
FIG. 9A is a plan view illustrating a principal part of a physical quantity sensor according to a second variation of the first embodiment.
Figure 9B:
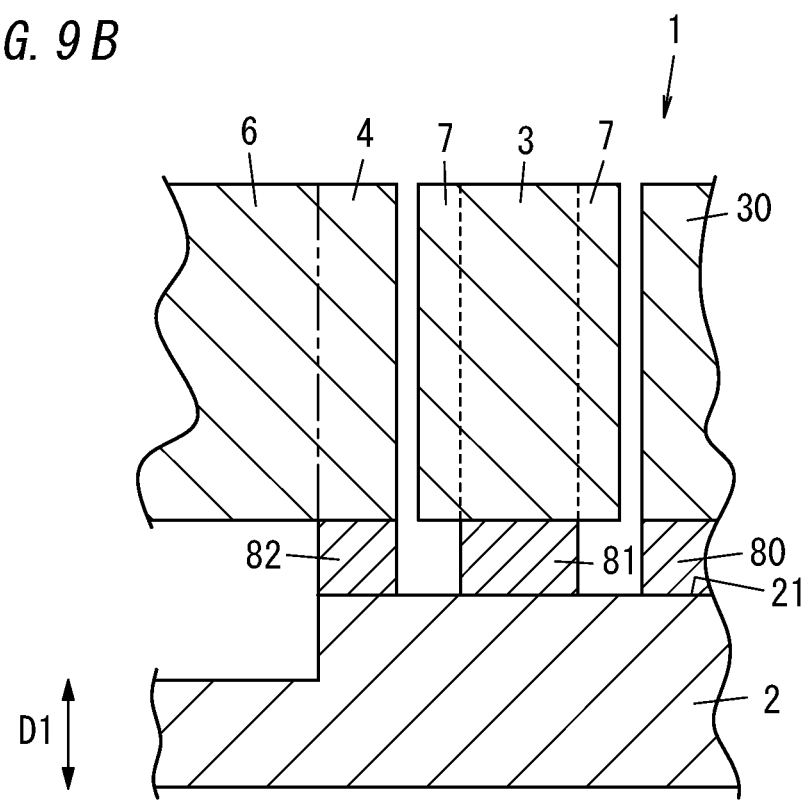
FIG. 9B is a cross-sectional view thereof taken along the plane A-A shown in FIG. 9A.

In a physical quantity sensor 1 according to a second variation, the shape and number of the beam portions 7 connected to the anchor portion 3 are different as shown in FIGS. 9A and 9B from the shape and number of the beam portions 7 connected to the anchor portion 3 in the physical quantity sensor 1 according to the first embodiment.

Specifically, in the physical quantity sensor 1 according to the second variation, four beam portions 7 are connected to the anchor portion 3. In the physical quantity sensor 1 according to the second variation, each of the four beam portions 7 has a bent portion 73 when viewed in plan in the thickness direction D1 defined with respect to the substrate 2. In the physical quantity sensor 1 according to the second variation, each of the four beam portions 7 has an L-shape when viewed in plan in the thickness direction D1 defined with respect to the substrate 2. In the physical quantity sensor 1 according to the second variation, the four beam portions 7 are arranged to have rotational symmetry around the anchor portion 3 when viewed in plan in the thickness direction D1 defined with respect to the substrate 2. Each of the four beam portions 7 is connected to a middle of an associated one of the four sides of the anchor portion 3 when viewed in plan in the thickness direction D1 defined with respect to the substrate 2. Thus, when viewed in plan in the thickness direction D1 defined with respect to the substrate 2, the respective ends, connected to the anchor portion 3, of the four beam portions 7 are arranged at regular intervals along the outer periphery of the anchor portion 3. The physical quantity sensor 1 according to the second variation allows increasing the length of the beam portions 7, compared to the physical quantity sensor 1 according to the first embodiment, without changing the gap distance between the anchor portion 3 and the surrounding portion 4.

Third Variation of First Embodiment

Figure 10A:
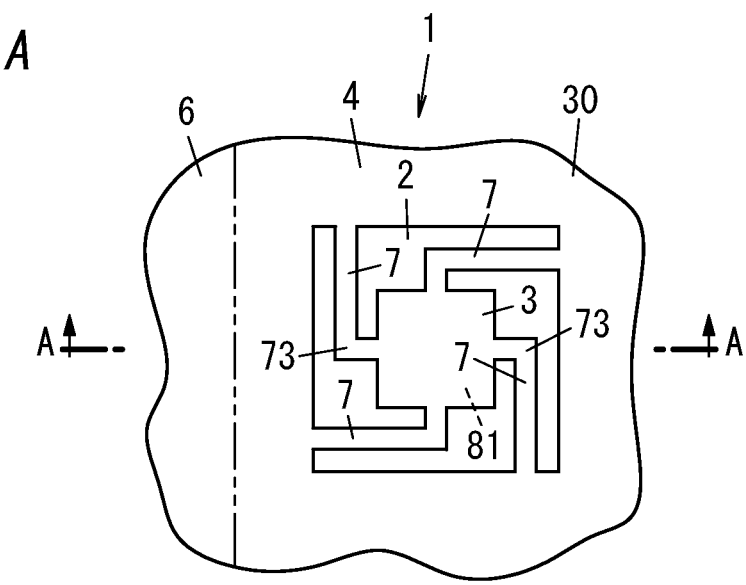
FIG. 10A is a plan view illustrating a principal part of a physical quantity sensor according to a third variation of the first embodiment.
Figure 10B:
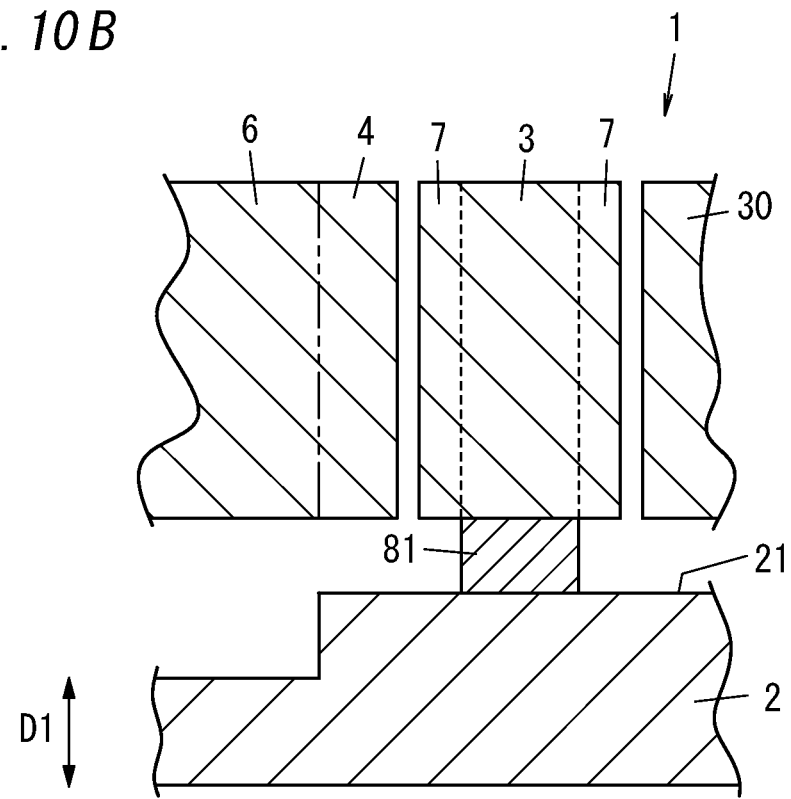
FIG. 10B is a cross-sectional view thereof taken along the plane A-A shown in FIG. 10A.

In a physical quantity sensor 1 according to a third variation, the surrounding portion 4 is not fixed to the substrate 2 as shown in FIGS. 10 and 10B, which is a major difference from the physical quantity sensor 1 according to the second variation of the first embodiment. The physical quantity sensor 1 according to the third variation may further reduce the transmission of the stress from the substrate 2 to the moving portion 6 and the detecting elements 5, compared to the physical quantity sensor 1 according to the second variation.

Fourth Variation of First Embodiment

Figure 11A:
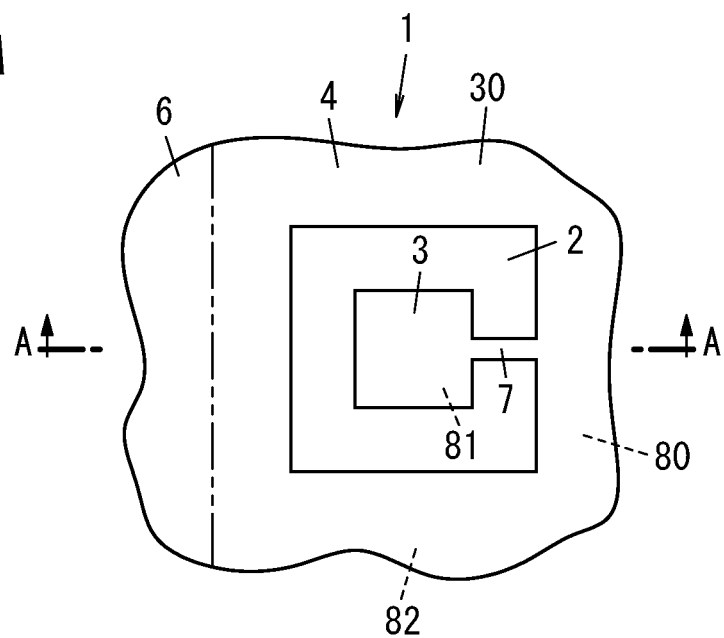
FIG. 11A is a plan view illustrating a principal part of a physical quantity sensor according to a fourth variation of the first embodiment.
Figure 11B:
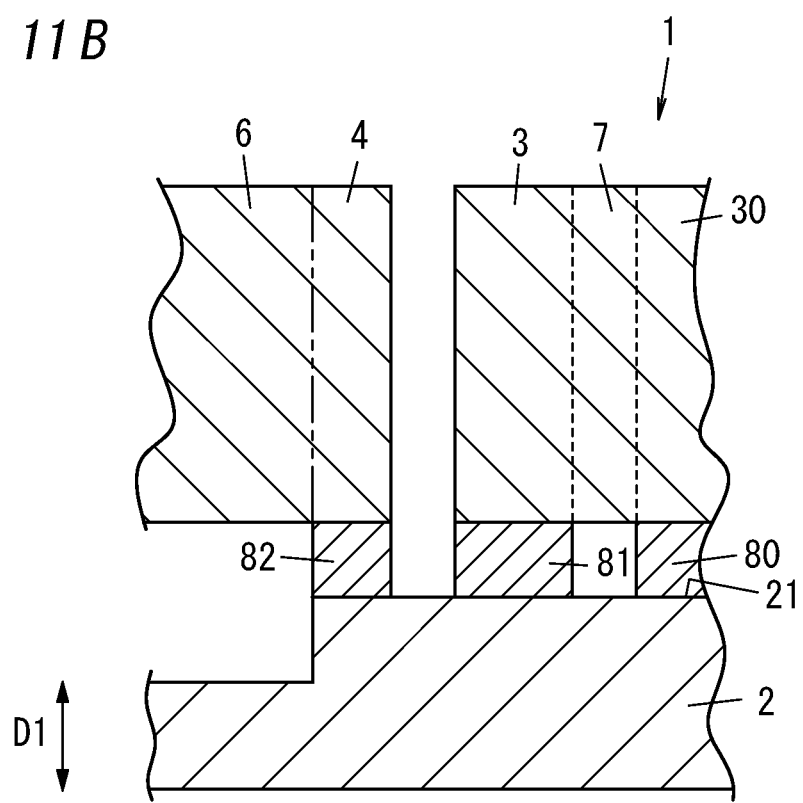
FIG. 11B is a cross-sectional view thereof taken along the plane A-A shown in FIG. 11A.

In a physical quantity sensor 1 according to the fourth variation, only one beam portion 7 is connected to the anchor portion 3 as shown in FIGS. 11A and 11B, which is a major difference from the physical quantity sensor 1 according to the first embodiment. The physical quantity sensor 1 according to the fourth variation may further reduce the transmission of the stress from the substrate 2 to the moving portion 6 and the detecting elements 5, compared to the physical quantity sensor 1 according to the first embodiment.

Optionally, in the physical quantity sensor 1 according to the fourth variation, the anchor portion 3 may form part of a base portion 301 of the supporting portion 30. In that case, an external connection electrode may be provided on the anchor portion 3. Then, part of a wiring portion connected to the external connection electrode will be formed on the beam portion 7.

Fifth Variation of First Embodiment

Figure 12A:
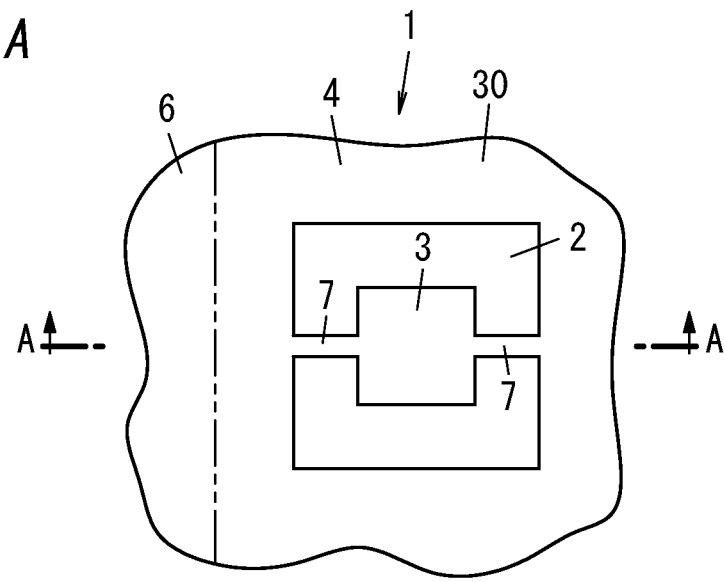
FIG. 12A is a plan view illustrating a principal part of a physical quantity sensor according to a fifth variation of the first embodiment.
Figure 12B:
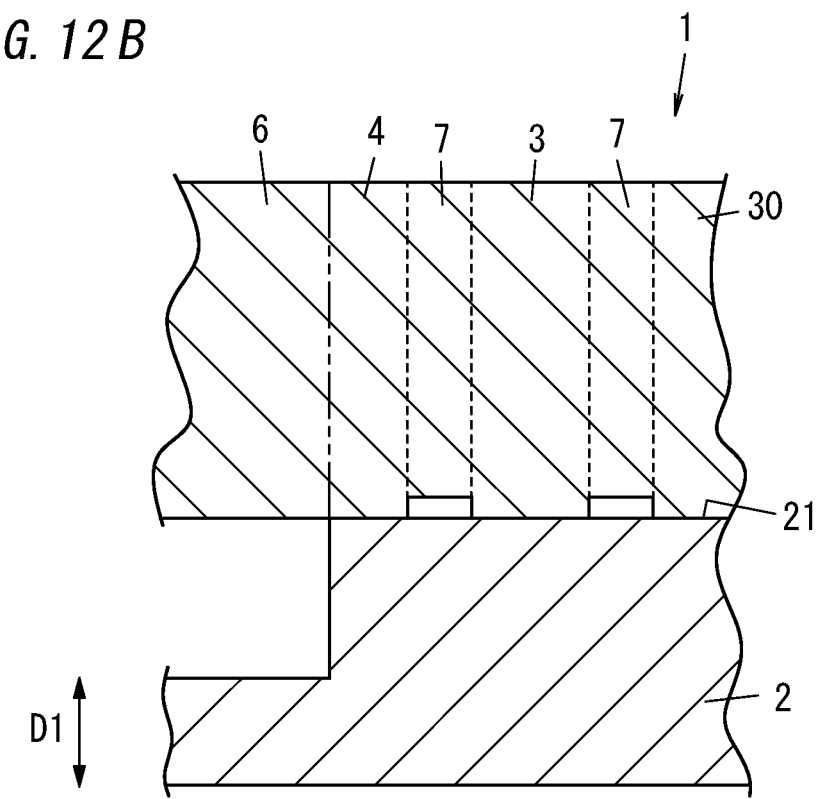
FIG. 12B is a cross-sectional view thereof taken along the plane A-A shown in FIG. 12A.

In the physical quantity sensor 1 according to the fifth variation, the supporting portion 30 is bonded directly to the substrate 2 as shown in FIGS. 12A and 12B with no bonding portion 80 interposed between them, which is a major difference from the physical quantity sensor 1 according to the first embodiment. In the physical quantity sensor 1 according to the fifth variation, the anchor portion 3 and surrounding portion 4 of the supporting portion 30 are directly bonded to the substrate 2.

In the physical quantity sensor 1 according to the fifth variation, the beam portions 7 are not fixed to the substrate 2. In addition, in the physical quantity sensor 1 according to the fifth variation, the beam portions 7 are spaced from the substrate 2 in the thickness direction D1 defined with respect to the substrate 2 such that a gap is left between the beam portions 7 and the substrate 2. Furthermore, in the physical quantity sensor 1 according to the fifth variation, the respective principal surfaces, opposite from the substrate 2, of the anchor portion 3, the surrounding portion 4, and the beam portions 7, for example, are flush with each other and the dimension of the beam portions 7 is smaller as measured in the thickness direction D1 defined with respect to the substrate 2 than the dimension of the anchor portion 3.

The physical quantity sensor 1 according to the fifth variation has a configuration in which the anchor portion 3 and surrounding portion 4 of the supporting portion 30 are directly bonded to the substrate 2 but may still reduce the transmission of the stress from the substrate 2 to the moving portion 6 and the detecting elements 5.

Second Embodiment

A physical quantity sensor 1 according to a second embodiment will now be described with reference to FIGS. 13-16.

(2.1) Overview

A physical quantity sensor 1A according to a second exemplary embodiment includes a substrate 2A, an anchor portion 3A, a surrounding portion 4A, a detecting element 5A, a moving portion 6A, and beam portions 7A as shown in FIGS. 13-15B. The anchor portion 3A is formed on the same side as the principal surface 21A of the substrate 2A and fixed to the substrate 2A. The surrounding portion 4A is formed on the same side as the principal surface 21A of the substrate 2A and surrounds the anchor portion 3A. The detecting element 5A detects a physical quantity as a target of detection. The moving portion 6A is provided with at least a part of the detecting element 5A, formed on the same side as the principal surface 21A of the substrate 2A, and connected to the surrounding portion 4A. The beam portions 7A are formed on the same side as the principal surface 21A of the substrate 2A and connect the anchor portion 3A and the surrounding portion 4A together. As used herein, the principal surface 21A of the substrate 2A refers to one surface thereof, formed on the same side as the anchor portion 3A, out of the two surfaces of the substrate 2A which intersect with the thickness direction D1A defined with respect to the substrate 2A.

The physical quantity sensor 1A according to the second embodiment is designed to detect an acceleration as its target physical quantity. Therefore, the physical quantity sensor 1A according to the second embodiment is an acceleration sensor.

The physical quantity sensor 1A according to the second embodiment may transduce, for example, acceleration into an electrical signal. That is to say, the physical quantity sensor 1A according to the second embodiment serves as a transducer for transducing an acceleration into an electrical signal. The physical quantity sensor 1A is applicable for use in, for example, consumer electronic appliances, mobile telecommunications devices, cameras, wearable terminals, game consoles, vehicles (including automobiles and two-wheeled vehicles), robots, construction machines, drones, aircrafts, and watercrafts.

Figure 13:
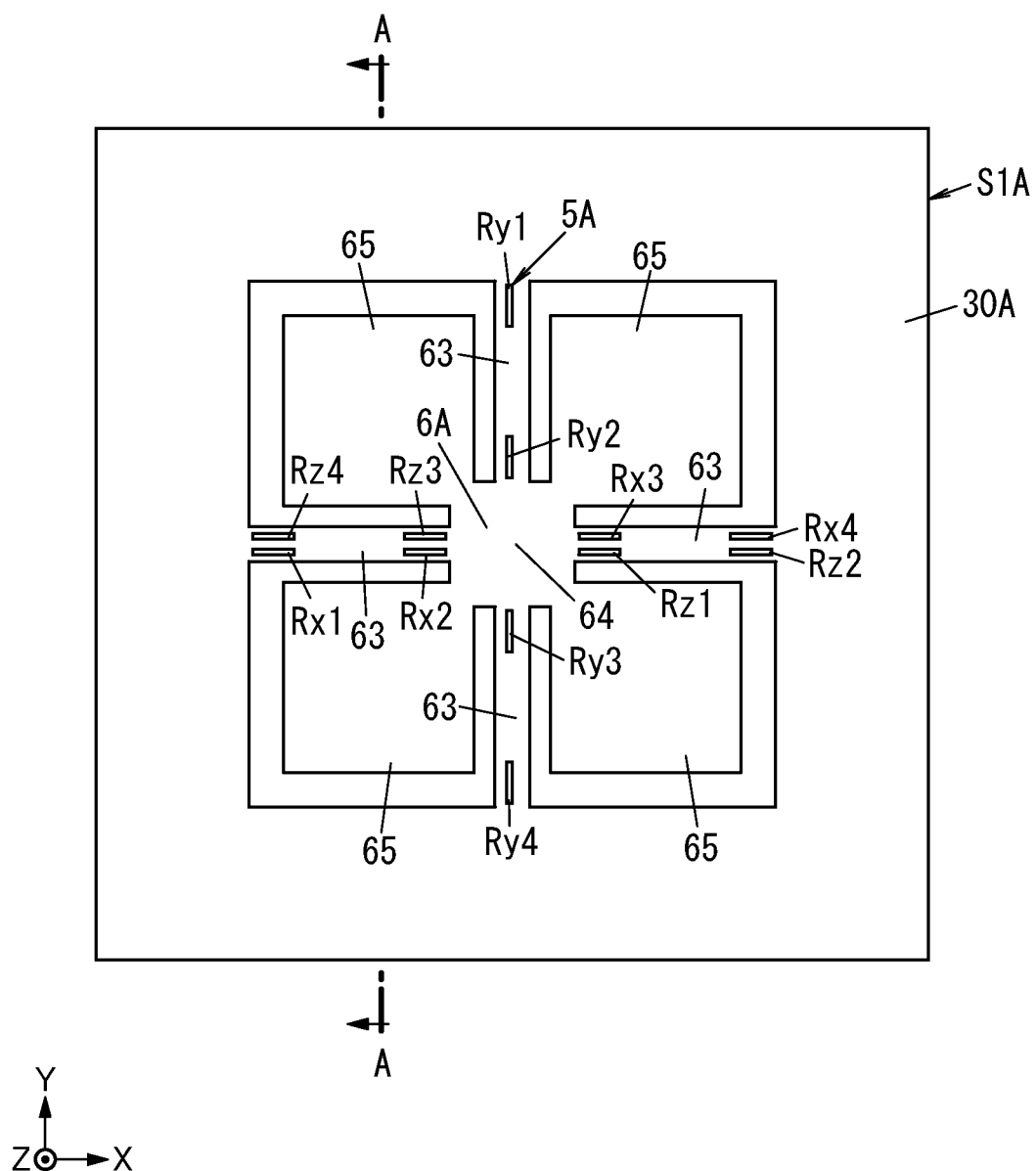
FIG. 13 is a plan view of a physical quantity sensor according to a second embodiment.

A physical quantity sensor 1A according to the second embodiment is a piezoresistive triaxial acceleration sensor. The detecting element 5A includes a plurality of piezoresistors Rx1-Rx4, Ry1-Ry4, Rz1-Rz4, as shown in FIG. 13.

(2.2) Details

A configuration for the physical quantity sensor 1A according to the second embodiment will be described in detail with reference to FIGS. 13-16.

(2.2.1) Overall Configuration of Physical Quantity Sensor

The physical quantity sensor 1A includes a substrate 2A, a structure S1A, and a cover 11. The structure 51A may be formed by, for example, machining a silicon wafer by MEMS manufacturing technology. Therefore, the material for the structure S1A includes silicon.

The structure S1A includes a frame-shaped (e.g., square in the example illustrated in FIG. 13) supporting portion 30A and a moving portion 6A arranged inside the supporting portion 30A. When viewed in plan in the thickness direction D1A defined with respect to the substrate 2A, the inner periphery of the supporting portion 30A has a square shape.

In the following description, an orthogonal coordinate system with three axes that intersect with each other at right angles (namely, an X-axis, a Y-axis, and a Z-axis) is defined. Particularly, the "Z-axis" is supposed to be an axis aligned with the thickness direction D1A defined with respect to the substrate 2A. Note that the origin of the orthogonal coordinate system is set at a center point of the moving portion 6A when viewed in plan in the thickness direction D1A defined with respect to the substrate 2A. Note that each of the X-, Y-, and Z-axes is a virtual axis and the arrows indicating X, Y, and Z on the drawings are shown there just for the sake of convenience of description and are all insubstantial ones. In addition, these arrows should not be construed as limiting the directions in which the physical quantity sensor 1 is supposed to be used.

The moving portion 6A includes four flexible portions 63, one weight 64, and four auxiliary weights 65 as shown in FIG. 13. The weight 64 has a square shape when viewed in plan in the thickness direction D1A defined with respect to the substrate 2A. In addition, the weight 64 is spaced from the supporting portion 30A when viewed in plan in the thickness direction D1A defined with respect to the substrate 2A. The distance as measured in the positive X-axis direction between the weight 64 and the supporting portion 30A is equal to the distance as measured in the Y-axis direction between the weight 64 and the supporting portion 30A.

The four flexible portions 63 extend in four directions from the weight 64 when viewed in plan in the thickness direction D1A defined with respect to the substrate 2A. More specifically, the four flexible portions 63 are each extended one by one from the middle of an associated one of the four sides of the weight 64. One end of each of the four flexible portions 63 is connected to the weight 64 while the other end of each of the four flexible portions 63 is connected to the supporting portion 30A. In this embodiment, two flexible portions 63 out of the four flexible portions 63 extend in the positive and negative X-axis directions, respectively, while the other two flexible portions 63 extend in the positive and negative Y-axis directions, respectively.

Also, the four auxiliary weights 65 are connected one by one to the four corners of the weight 64. Each of the auxiliary weights 65 is provided in an area surrounded with the weight 64, the supporting portion 30A, and associated two flexible portions 63 and is out of contact with the supporting portion 30A and the two flexible portions 63.

The four flexible portions 63 have a smaller thickness as measured in the thickness direction D1A defined with respect to the substrate 2A than the supporting portion 30A, the weight 64, and the auxiliary weights 65. In this structure S1A, the respective principal surfaces, opposite from the substrate 2A, of the flexible portions 63, the supporting portion 30A, the weight 64, and the auxiliary weights 65 are flush with each other. In the structure S1A, the supporting portion 30A, the weight 64, and the auxiliary weights 65 have the same dimension as measured in the thickness direction D1A defined with respect to the substrate 2A. However, this is only an example and should not be construed as limiting.

As described above, the detecting element 5A includes a plurality of piezoresistors Rx1-Rx4, Ry1-Ry4, Rz1-Rz4. In the physical quantity sensor 1A, one end, connected to the supporting portion 30A, of the flexible portion 63 located in the negative X-axis direction as viewed from the weight 64 is provided with piezoresistors Rx1, Rz4, while the other end thereof connected to the weight 64 is provided with piezoresistors Rx2, Rz3. In addition, in the physical quantity sensor 1A, one end, connected to the supporting portion 30A, of the flexible portion 63 located in the positive X-axis direction as viewed from the weight 64 is provided with piezoresistors Rx4, Rz2, while the other end thereof connected to the weight 64 is provided with piezoresistors Rx3, Rz1. Furthermore, in the physical quantity sensor 1A, one end, connected to the supporting portion 30A, of the flexible portion 63 located in the positive Y-axis direction as viewed from the weight 64 is provided with a piezoresistor Ry1, while the other end thereof connected to the weight 64 is provided with a piezoresistor Ry2. Furthermore, in the physical quantity sensor 1A, one end, connected to the supporting portion 30A, of the flexible portion 63 located in the negative Y-axis direction as viewed from the weight 64 is provided with a piezoresistor Ry4, while the other end thereof connected to the weight 64 is provided with a piezoresistor Ry3.

Figure 16:
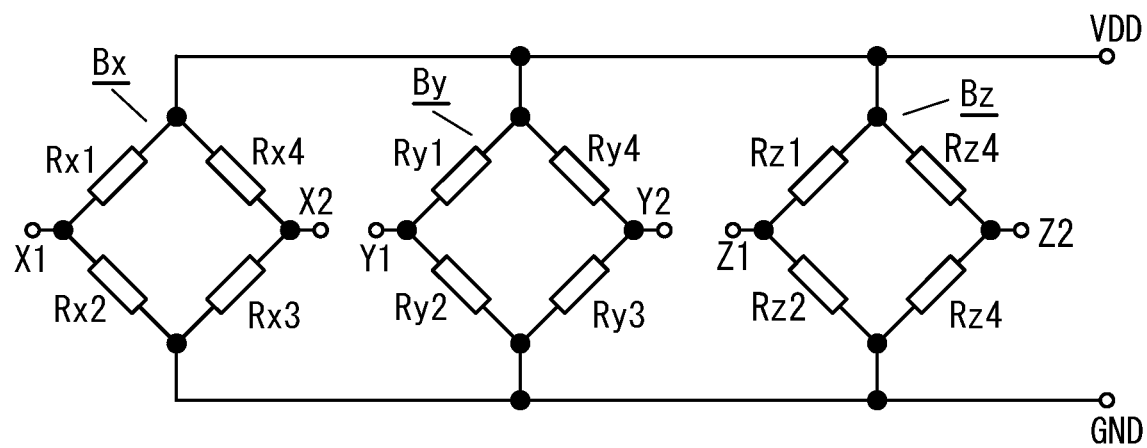
FIG. 16 is a circuit diagram of the physical quantity sensor.

The physical quantity sensor 1A includes a bridge circuit Bx formed by bridge-connecting the four piezoresistors Rx1-Rx4 as shown in FIG. 16. The bridge circuit Bx is a circuit for detecting acceleration in the X-axis direction.

The physical quantity sensor 1A also includes a bridge circuit By formed by bridge-connecting the four piezoresistors Ry1-Ry4 as shown in FIG. 16. The bridge circuit By is a circuit for detecting acceleration in the Y-axis direction.

The physical quantity sensor 1A further includes a bridge circuit Bz formed by bridge-connecting the four piezoresistors Rz1-Rz4 as shown in FIG. 16. The bridge circuit Bz is a circuit for detecting acceleration in the Z-axis direction.

In addition, the physical quantity sensor 1A further includes a plurality of external connection electrodes (external connection terminals). As shown in FIG. 16, the plurality of external connection electrodes includes a pair of input terminals VDD, GND for applying a voltage (e.g., a constant DC voltage) from an external power supply to the bridge circuits Bx-Bz, a pair of output terminals X1, X2 of the bridge circuit Bx, a pair of output terminals Y1, Y2 of the bridge circuit By, and a pair of output terminals Z1, Z2 of the bridge circuit Bz. The plurality of external connection electrodes may be, for example, provided on the supporting portion 30A and exposed through a plurality of through holes provided through the cover 11. However, this is only an example of the present disclosure and should not be construed as limiting. Alternatively, the plurality of external connection electrodes may also be provided on the cover 11, for example. In that case, the cover 11 may be provided with, for example, a plurality of through interconnects for connecting the plurality of external connection electrodes one to one to a plurality of electrodes.

In the physical quantity sensor 1A, the substrate 2A, the structure S1A, and cover 11 are arranged in the thickness direction D1A defined with respect to the substrate 2A as shown in FIG. 14. Note that the substrate 2A and the cover 11 is spaced from the moving portion 6A in the thickness direction D1A defined with respect to the substrate 2A and also serve as a stopper for reducing the chances of the moving portion 6A being displaced excessively in the Z-axis direction.

The substrate 2A, the structure S1A, and the cover 11 all have substantially the same outer peripheral shapes when viewed in plan in the thickness direction D1A defined with respect to the substrate 2A.

The substrate 2A may be, for example, a silicon substrate. The physical quantity sensor 1A includes a bonding portion 80 interposed between the substrate 2A and the supporting portion 30A of the structure S1A. The bonding portion 80 bonds the substrate 2A and the structure S1A together. The bonding portion 80 may be a resin layer, for example.

Optionally, the surface, facing the structure S1A, of the substrate 2A may have a recess 50A (see FIG. 15B) for increasing the displacement in the Z-axis direction of the moving portion 6A.

The cover 11 may be a silicon substrate, for example. The physical quantity sensor 1A includes a bonding portion 90 interposed between the cover 11 and the supporting portion 30A of the structure S1A. The bonding portion 90 bonds the cover 11 and the structure S1A together. The bonding portion 90 may be a resin layer, for example. Examples of materials for the resin layer include epoxy-based resins and silicone-based resins.

Optionally, the surface, facing the structure S1A, of the cover 11 may have a recess 110 (see FIG. 15B) for increasing the displacement in the Z-axis direction of the moving portion 6A.

(2.2.2) Operation of Physical Quantity Sensor

In the physical quantity sensor 1A according to the second embodiment, the weight 64 and the respective auxiliary weights 65 are displaced upon the application of acceleration to the physical quantity sensor 1A, thus causing strain in the respective flexible portions 63. The acceleration applied to the physical quantity sensor 1A may be detected by detecting this strain.

In the physical quantity sensor 1A, when acceleration is applied in the X-axis direction while a constant DC voltage is applied between the pair of input terminals VDD, GND, the potential difference between the pair of output terminals X1, X2 varies according to the magnitude of the acceleration applied in the X-axis direction. In the same way, in the physical quantity sensor 1A, when acceleration is applied in the Y-axis direction, the potential difference between the output terminals Y1, Y2 of the bridge circuit By varies according to the magnitude of the acceleration applied in the Y-axis direction. In the same way, in the physical quantity sensor 1A, when acceleration is applied in the Z-axis direction, the potential difference between the output terminals Z1, Z2 of the bridge circuit Bz varies according to the magnitude of the acceleration applied in the Z-axis direction. This allows the physical quantity sensor 1A to detect the acceleration applied in each of the X-, Y-, and Z-axis directions.

The physical quantity sensor 1A may be used, for example, to be electrically connected to a signal processing device. The signal processing device may be, for example, an ASIC. The signal processing device may include, for example, a drive circuit and a processing circuit. The drive circuit applies a constant DC voltage between the input terminals VDD, GND of the physical quantity sensor 1A. The processing circuit performs signal processing on an electrical signal provided by the detecting element 5A of the physical quantity sensor 1A. The processing circuit may obtain acceleration in each of the X-, Y-, and Z-axis directions by, for example, converting an analog electrical signal (analog signal) provided by the detecting elements 5A of the physical quantity sensor 1A into a digital signal and performing appropriate arithmetic processing on the digital signal. Optionally, the physical quantity sensor 1A may be used to be housed in the package or mounted on a printed wiring board.

(2.2.3) Details of Anchor Portion and Beam Portions of Physical Quantity Sensor

Figure 15A:
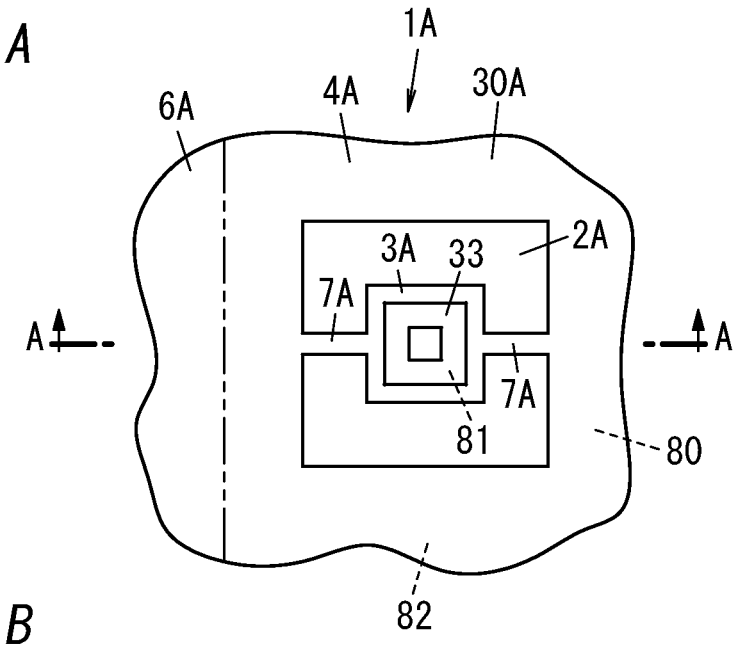
FIG. 15A is a plan view illustrating a principal part of the physical quantity sensor.
Figure 15B:
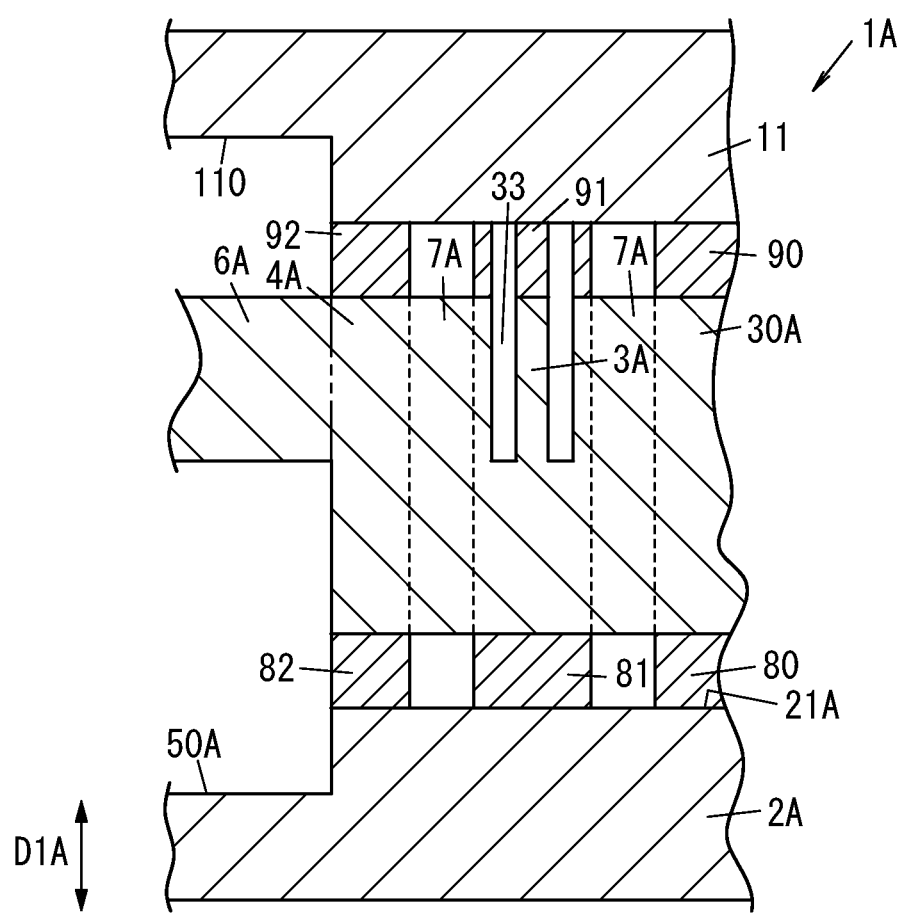
FIG. 15B is a cross-sectional view thereof taken along the plane A-A shown in FIG. 15A.

In the physical quantity sensor 1A according to the second embodiment, the anchor portion 3A and the surrounding portion 4A are connected via the beam portions 7A as shown in FIGS. 15A and 15B. Thus, the physical quantity sensor 1A has a space surrounded with the anchor portion 3A, the surrounding portion 4A, and the beam portions 7A, thus allowing reducing the bonding area between the supporting portion 30A and the substrate 2A. In the physical quantity sensor 1A according to the second embodiment, the anchor portion 3A is formed by, for example, parts, located close to the flexible portions 63, of the supporting portion 30A.

In the physical quantity sensor 1A according to the second embodiment, the anchor portion 3A has a square shape when viewed in plan in the thickness direction D1A defined with respect to the substrate 2A. In addition, in the physical quantity sensor 1A according to the second embodiment, each of the two beam portions 7A has a linear shape when viewed in plan in the thickness direction D1A defined with respect to the substrate 2A. In the physical quantity sensor 1A according to the second embodiment, the two beam portions 7A are arranged side by side in straight line with the center of the anchor portion 3A interposed between them when viewed in plan in the thickness direction D1A defined with respect to the substrate 2A.

In the physical quantity sensor 1A according to the second embodiment, the maximum dimension of the anchor portion 3A is the same as the respective dimensions of the surrounding portion 4A and the beam portions 7A when measured in the thickness direction D1A defined with respect to the substrate 2A. In the physical quantity sensor 1A according to the second embodiment, the respective principal surfaces, opposite from the substrate 2A, of the anchor portion 3A, the surrounding portion 4A, and the beam portions 7A, for example, may be flush with each other. In addition, in the physical quantity sensor 1A according to the second embodiment, the beam portions 7A are integrated with the anchor portion 3A and the surrounding portion 4A. Furthermore, in the physical quantity sensor 1A according to the second embodiment, the surrounding portion 4A is integrated with the moving portion 6A. Note that the maximum dimension of the anchor portion 3A and the dimension of the beam portions 7A as measured in the thickness direction D1A defined with respect to the substrate 2A may fall, for example, within the range from a few ten μm to several hundred μm. In addition, the beam portions 7A may have a width falling, for example, within the range from a few μm to several ten μm when viewed in plan in the thickness direction D1A defined with respect to the substrate 2A.

Furthermore, in the physical quantity sensor 1A according to the second embodiment, the surrounding portion 4A is fixed to the substrate 2A. The physical quantity sensor 1A according to the second embodiment includes: the first bonding portion 81 interposed between the substrate 2A and the anchor portion 3A; and the second bonding portion 82 interposed between the substrate 2A and the surrounding portion 4A. The first bonding portion 81 and the second bonding portion 82 are spaced apart from each other along the principal surface 21A of the substrate 2A. In addition, a gap is left between each of the two beam portions 7A and the principal surface 21A of the substrate 2A. Furthermore, in each of the two beam portions 7A, the rigidity in the width direction defined with respect to the beam portion 7A (i.e., as measured in the upward/downward direction in FIG. 15A) is lower than the rigidity in the length direction defined with respect to the beam portion 7A (i.e., as measured in the rightward/leftward direction in FIG. 15A) and the rigidity in the thickness direction D1A defined with respect to the substrate 2A (see FIG. 15B). This allows each of the two beam portions 7A to serve as a spring which is elastically deformable in the width direction.

In the physical quantity sensor 1A according to the second embodiment, the two beam portions 7A are connected to the anchor portion 3A. In the structure made up of the anchor portion 3A and the two beam portions 7A when viewed in plan in the thickness direction D1A defined with respect to the substrate 2A, the two beam portions 7A are arranged to have rotational symmetry around the center axis of the anchor portion 3A when viewed in plan in the thickness direction D1A defined with respect to the substrate 2A.

In the physical quantity sensor 1A according to the second embodiment, the surrounding portion 4A is fixed to the cover 11 on the other side opposite from the substrate 2A. The bonding portion 90 of the physical quantity sensor 1A according to the second embodiment includes a first bonding portion 91 interposed between the cover 11 and the anchor portion 3A and a second bonding portion 92 interposed between the cover 11 and the surrounding portion 4A. The first bonding portion 91 and the second bonding portion 92 are spaced from each other. There is a gap left between each of the two beam portions 7A and the cover 11.

The anchor portion 3A has an annular recess 33 provided on the principal surface thereof facing the cover 11. Thus, the anchor portion 3A has a smaller bonding area with respect to the first bonding portion 91, compared to a situation where the anchor portion 3A has no recesses 33.

In the physical quantity sensor 1A, the supporting portion 30A, for example, suitably includes anchor portions 3A, of which the number is at least equal to that of the flexible portions 63. In that case, one anchor portion 3A is suitably provided in the vicinity of each of the four flexible portions 63.

Alternatively, in the physical quantity sensor 1A, the supporting portion 30A may include a plurality of anchor portions 3A, of which the number is larger than that of the flexible portions 63. In that case, the surrounding portion 4A needs to surround at least one anchor portion 3A out of the plurality of anchor portions 3A or may surround two or more anchor portions 3A out of the plurality of anchor portions 3A.

(2.3) Advantages

A physical quantity sensor 1A according to the second embodiment includes a substrate 2A, an anchor portion 3A, a surrounding portion 4A, a detecting element 5A, a moving portion 6A, and a beam portion 7A. The anchor portion 3A is formed on the same side as a principal surface 21A of the substrate 2A and fixed to the substrate 2A. The surrounding portion 4A is formed on the same side as the principal surface 21A of the substrate 2A and surrounds the anchor portion 3A. The detecting element 5A detects a physical quantity as a target of detection. The moving portion 6A is provided with at least a part of the detecting element 5A, formed on the same side as the principal surface 21A of the substrate 2A, and connected to the surrounding portion 4A. The beam portion 7A is formed on the same side as the principal surface 21A of the substrate 2A and connects the anchor portion 3A and the surrounding portion 4A together. This allows the physical quantity sensor 1A according to the second embodiment to reduce the chances of external stress transmitted from the substrate 2A to the anchor portion 3A being further transmitted to the moving portion 6A, thus enabling reducing a variation in sensor characteristic. In addition, the physical quantity sensor 1A according to the second embodiment may improve, for example, the temperature characteristic of an offset voltage by reducing the transmission of the stress to the moving portion 6A and the detecting element 5A. Thus, the physical quantity sensor 1A according to the second embodiment may reduce a variation in sensor characteristic due to temperature variations.

First Variation of Second Embodiment

Figure 17A:
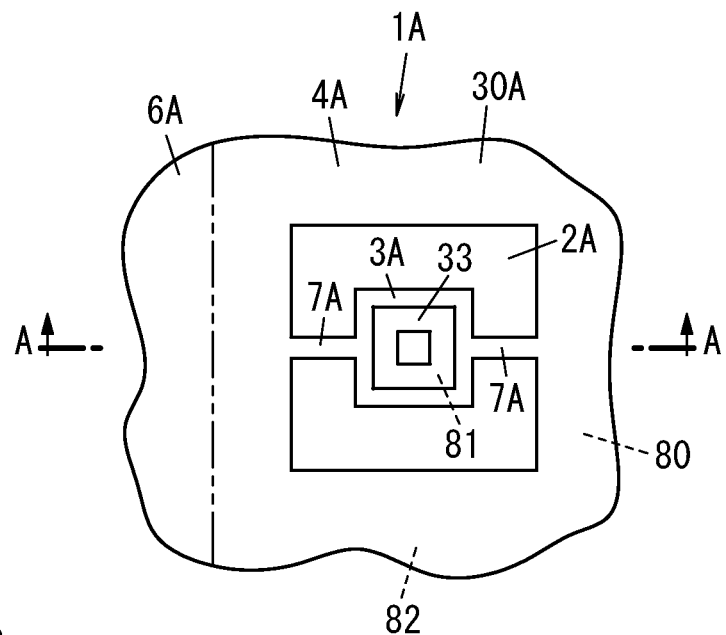
FIG. 17A is a plan view illustrating a principal part of a physical quantity sensor according to a first variation of the second embodiment.
Figure 17B:
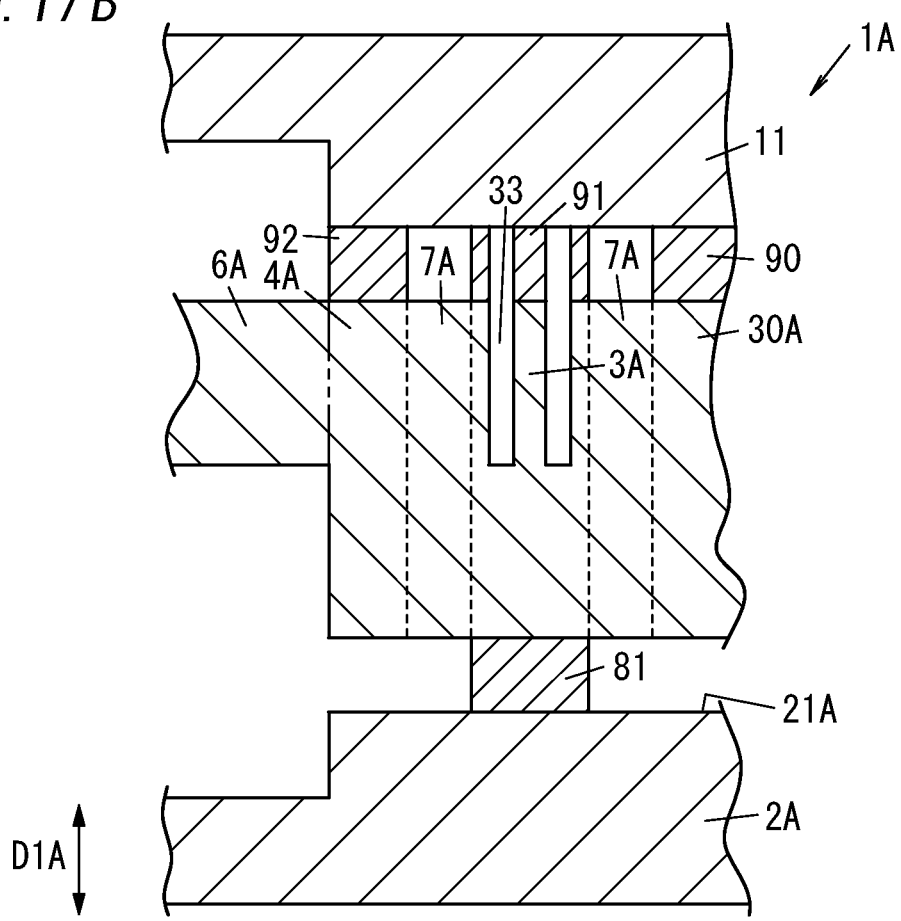
FIG. 17B is a cross-sectional view thereof taken along the plane A-A shown in FIG. 17A.

In a physical quantity sensor 1A according to a first variation, the surrounding portion 4A is not fixed to the substrate 2A as shown in FIGS. 17A and 17B, which is a major difference from the physical quantity sensor 1A according to the second embodiment. The physical quantity sensor 1A according to the first variation may further reduce the transmission of the stress from the substrate 2A to the moving portion 6A and the detecting element 5A, compared to the physical quantity sensor 1A according to the second embodiment. In the physical quantity sensor 1A according to the first variation, the surrounding portion 4A is fixed to the cover 11. However, the surrounding portion 4A does not have to be fixed to the cover 11.

Second Variation of Second Embodiment

Figure 18A:
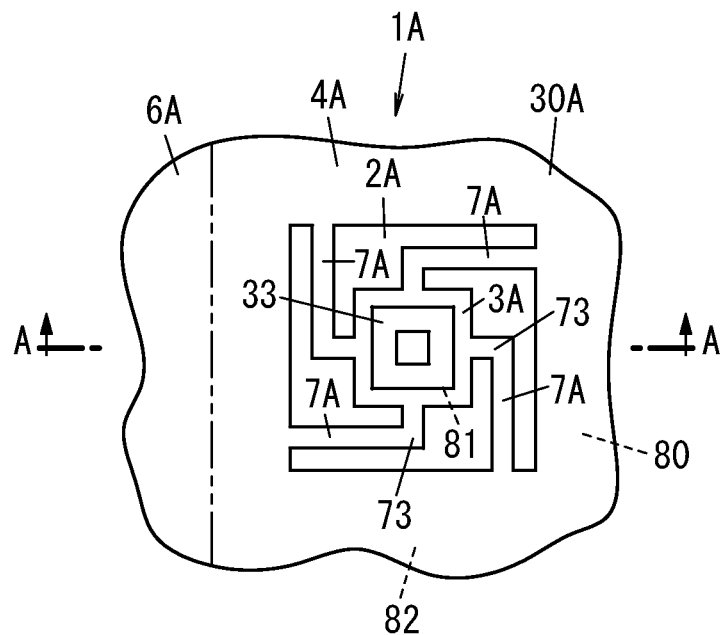
FIG. 18A is a plan view illustrating a principal part of a physical quantity sensor according to a second variation of the second embodiment.
Figure 18B:
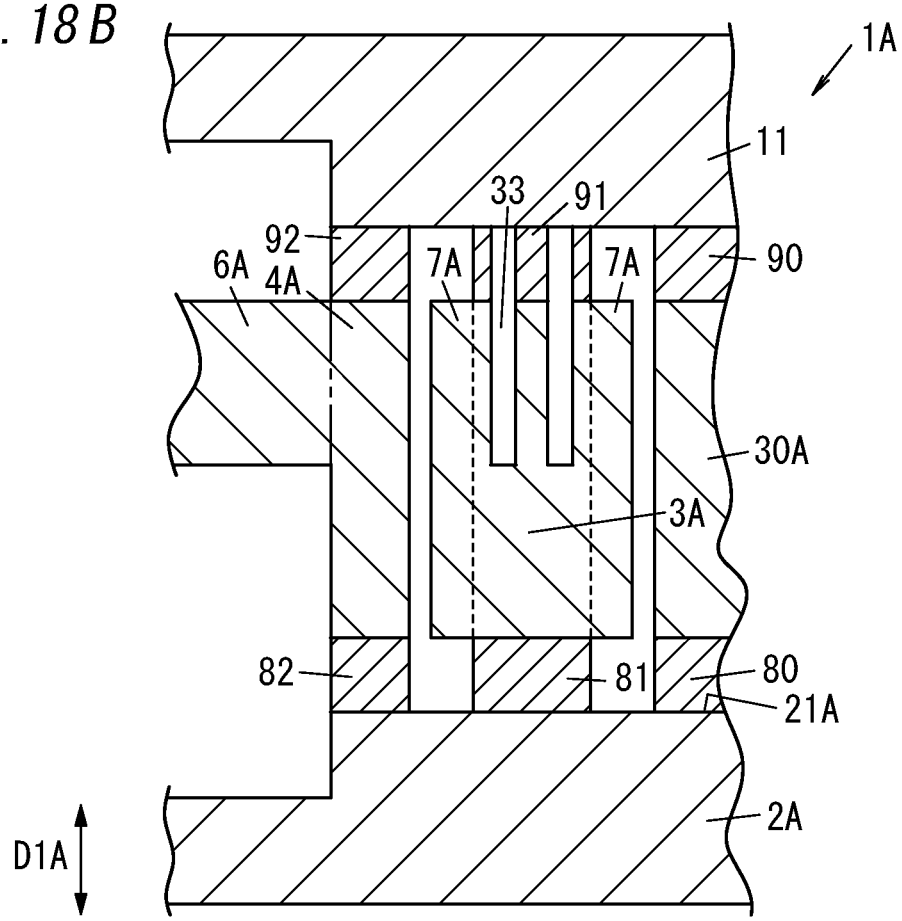
FIG. 18B is a cross-sectional view thereof taken along the plane A-A shown in FIG. 18A.

In a physical quantity sensor 1A according to a second variation, the shape and number of the beam portions 7A connected to the anchor portion 3A are different as shown in FIGS. 18A and 18B from the shape and number of the beam portions 7A connected to the anchor portion 3A in the physical quantity sensor 1A according to the second embodiment.

Specifically, in the physical quantity sensor 1A according to the second variation, four beam portions 7A are connected to the anchor portion 3A. In the physical quantity sensor 1A according to the second variation, each of the four beam portions 7A has a bent portion 73 when viewed in plan in the thickness direction D1A defined with respect to the substrate 2A. In the physical quantity sensor 1A according to the second variation, each of the four beam portions 7A has an L-shape when viewed in plan in the thickness direction D1A defined with respect to the substrate 2A. In the physical quantity sensor 1A according to the second variation, the four beam portions 7A are arranged to have rotational symmetry around the anchor portion 3A when viewed in plan in the thickness direction D1A defined with respect to the substrate 2A. Each of the four beam portions 7A is connected to a middle of an associated one of the four sides of the anchor portion 3A when viewed in plan in the thickness direction D1A defined with respect to the substrate 2A. Thus, the respective ends, connected to the anchor portion 3A, of the four beam portions 7A are arranged at regular intervals along the outer periphery of the anchor portion 3A. The physical quantity sensor 1A according to the second variation allows increasing the length of the beam portions 7A, compared to the physical quantity sensor 1A according to the second embodiment, without changing the gap distance between the anchor portion 3A and the surrounding portion 4A.

Third Variation of Second Embodiment

Figure 19A:
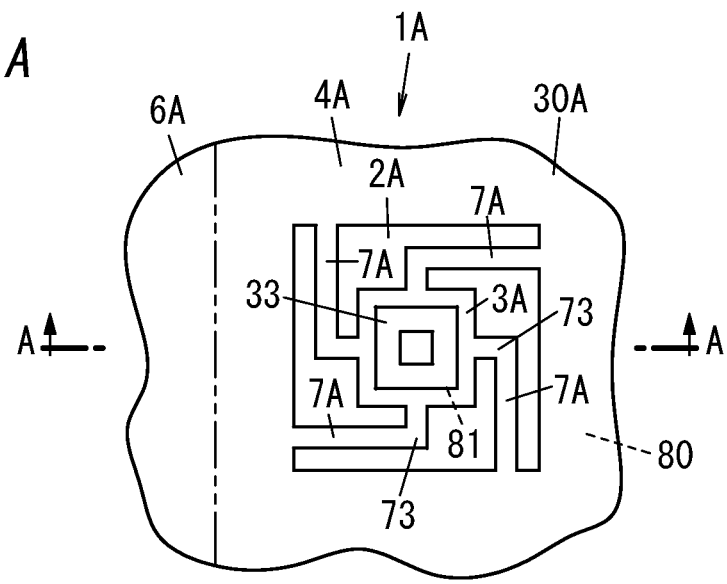
FIG. 19A is a plan view illustrating a principal part of a physical quantity sensor according to a third variation of the second embodiment.
Figure 19B:
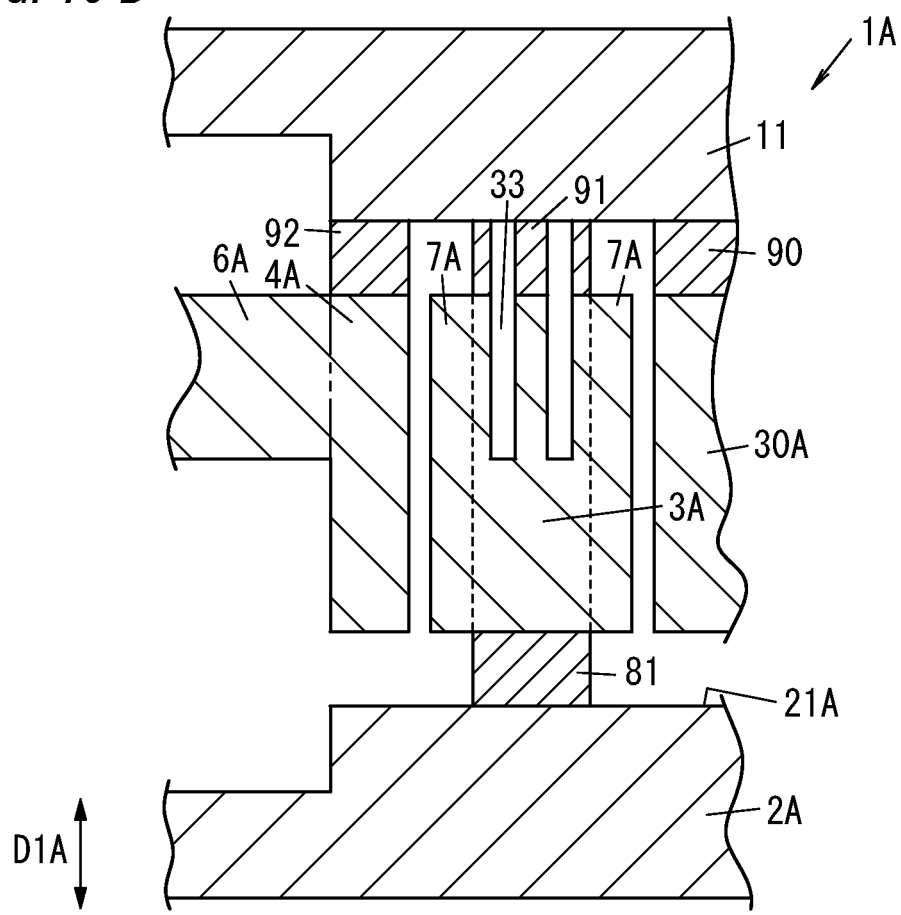
FIG. 19B is a cross-sectional view thereof taken along the plane A-A shown in FIG. 19A.

In a physical quantity sensor 1A according to a third variation, the surrounding portion 4A is not fixed to the substrate 2A as shown in FIGS. 19A and 19B, which is a major difference from the physical quantity sensor 1A according to the second variation of the second embodiment. The physical quantity sensor 1A according to the third variation may further reduce the transmission of the stress from the substrate 2A to the moving portion 6A and the detecting element 5A, compared to the physical quantity sensor 1A according to the second variation. In the physical quantity sensor 1A according to the first variation, the surrounding portion 4A is fixed to the cover 11. However, the surrounding portion 4A does not have to be fixed to the cover 11.

Other Variations of Second Embodiment

The structure S1A does not have to be a silicon wafer but may also be formed by machining a silicon on insulator (SOI) wafer by MEMS manufacturing technology, for example. The SOI wafer includes a silicon substrate, an insulating layer (such as a buried oxide film) formed on the silicon substrate, and a silicon layer formed on the insulating layer. When the SOI wafer is used, the thickness of the flexible portions 63 may be defined by the thickness of the silicon layer, thus achieving the advantage of increasing the precision of the thickness of the flexible portions 63.

Note that the embodiment described above is only an exemplary one of various embodiments of the present disclosure and should not be construed as limiting. Rather, the exemplary embodiment may be readily modified in various manners depending on a design choice or any other factor without departing from the scope of the present disclosure.

For example, in the physical quantity sensor 1 according to the first embodiment, the anchor portion 3 has a square outer peripheral shape when viewed in plan in the thickness direction D1 defined with respect to the substrate 2. However, this is only an example and should not be construed as limiting. Alternatively, the anchor portion 3 may also have a rectangular or circular outer peripheral shape for example. Likewise, in the physical quantity sensor 1A according to the second embodiment, the anchor portion 3A, as well as the anchor portion 3, has a square outer peripheral shape. However, this is only an example and should not be construed as limiting. Alternatively, the anchor portion 3A may also have a rectangular or circular outer peripheral shape, for example.

Furthermore, the physical quantity sensor 1 according to the first embodiment does not have to be fabricated using a silicon wafer but may also be fabricated using an SOI wafer. Alternatively, each of the physical quantity sensors 1 and 1A may also be fabricated by MEMS manufacturing technology and anodic bonding technique using a silicon wafer and a glass wafer. A material for the glass wafer may be, for example, borosilicate glass.

Furthermore, the material for the beam portions 7 and 7A does not have to be silicon but may also be a metal, an alloy, or a conductive resin, for example.

In the physical quantity sensor 1 according to the first embodiment, the drive element 12 is a piezoelectric element (piezoelectric actuator). However, this is only an example and should not be construed as limiting. Alternatively, the drive element 12 may also be an electrostatic actuator for driving the drive arms 61 with electrostatic force generated between a first drive electrode (fixed drive electrode) and a second drive electrode (movable drive electrode).

Furthermore, in the physical quantity sensor 1 according to the first embodiment, the detecting element 5 is a piezoelectric element. However, this is only an example and should not be construed as limiting. Alternatively, the detecting element 5 may also be a capacitor including a first detecting electrode (fixed detecting electrode) and a second detecting electrode (movable detecting electrode).

Furthermore, the physical quantity sensor 1A according to the second embodiment is a triaxial acceleration sensor. However, this is only an example and should not be construed as limiting. Alternatively, the physical quantity sensor 1A may also be a hexaxial acceleration sensor, a biaxial acceleration sensor, or a single axis acceleration sensor, for example. When the physical quantity sensor 1A is a single axis acceleration sensor, the structure may be, for example, a cantilever type structure in which the weight is supported in one direction by a supporting portion via a single or a plurality of flexible portions (beams).

Optionally, in the angular velocity sensor or the acceleration sensor, the detecting element may be either a capacitor including a first detecting electrode provided for the moving portion and a second detecting electrode provided for the supporting portion or a capacitor including a first detecting electrode provided for the moving portion and a second detecting electrode provided for the substrate, whichever is appropriate.

Furthermore, the physical quantity to be detected does not have to be an angular velocity or acceleration but may also be pressure, a sonic wave, or an ultrasonic wave, for example. If the physical quantity to be detected is pressure, the physical quantity sensor may be a diaphragm pressure sensor, for example. If the physical quantity to be detected is a sonic wave, then the physical quantity sensor may be a sonic sensor (including a microphone), for example. If the physical quantity to be detected is an ultrasonic wave, the physical quantity sensor may be an ultrasonic sensor, for example.

Furthermore, in the physical quantity sensor 1A according to the second embodiment, the substrate 2A does not have to be a silicon substrate but may also be a glass substrate, for example. In that case, the material for the glass substrate may be borosilicate glass, for example. If the substrate 2A is a glass substrate, then the substrate 2A and the structure S1A may be directly bonded together by anodic bonding, for example.

Furthermore, in the physical quantity sensor 1A according to the second embodiment, the cover 11 does not have to be a silicon substrate but may also be a glass substrate, for example. In that case, the material for the glass substrate may be borosilicate glass, for example. If the cover 11 is a glass substrate, then the cover 11 and the structure S1A may be directly bonded together by anodic bonding, for example.

Furthermore, the substrate 2, 2A does not have to be a silicon substrate, an SOI substrate, or a glass substrate, for example, but may also be printed wiring board or a package body, for example.

Aspects

A physical quantity sensor (1; 1A) according to a first aspect includes a substrate (2; 2A), an anchor portion (3; 3A), a surrounding portion (4; 4A), a detecting element (5; 5A), a moving portion (6; 6A), and a beam portion (7; 7A). The anchor portion (3; 3A) is formed on the same side as a principal surface (21; 21A) of the substrate (2; 2A) and fixed to the substrate (2; 2A). The surrounding portion (4; 4A) is formed on the same side as the principal surface (21; 21A) of the substrate (2; 2A) and surrounds the anchor portion (3; 3A). The detecting element (5; 5A) detects a physical quantity as a target of detection. The moving portion (6; 6A) is provided with at least a part of the detecting element (5; 5A), formed on the same side as the principal surface (21; 21A) of the substrate (2; 2A), and connected to the surrounding portion (4; 4A). The beam portion (7; 7A) is formed on the same side as the principal surface (21; 21A) of the substrate (2; 2A) and connects the anchor portion (3; 3A) and the surrounding portion (4; 4A) together.

The physical quantity sensor (1; 1A) according to the first aspect may reduce a variation in sensor characteristic.

In a physical quantity sensor (1; 1A) according to a second aspect, which may be implemented in conjunction with the first aspect, the surrounding portion (4; 4A) is fixed to the substrate (2; 2A).

The physical quantity sensor (1; 1A) according to the second aspect allows the moving portion (6; 6A) to be supported with more stability.

In a physical quantity sensor (1; 1A) according to a third aspect, which may be implemented in conjunction with the second aspect, the beam portion (7; 7A) is integrated with the anchor portion (3; 3A) and the surrounding portion (4; 4A).

The physical quantity sensor (1; 1A) according to the third aspect contributes to simplifying its manufacturing process.

A physical quantity sensor (1; 1A) according to a fourth aspect, which may be implemented in conjunction with the third aspect, further includes a first bonding portion (81) and a second bonding portion (82). The first bonding portion (81) is interposed between the anchor portion (3; 3A) and the substrate (2; 2A) to bond the anchor portion (3; 3A) and the substrate (2; 2A) together. The second bonding portion (82) is interposed between the surrounding portion (4; 4A) and the substrate (2; 2A) to bond the surrounding portion (4; 4A) and the substrate (2; 2A) together. Respective dimensions of the anchor portion (3; 3A), the surrounding portion (4; 4A), and the beam portion (7; 7A) are the same as each other when measured in a thickness direction (D1; D1A) defined with respect to the substrate (2; 2A).

The physical quantity sensor (1; 1A) according to the fourth aspect contributes to simplifying its manufacturing process.

In a physical quantity sensor (1; 1A) according to a fifth aspect, which may be implemented in conjunction with the first aspect, the surrounding portion (4; 4A) is not fixed to the substrate (2; 2A).

The physical quantity sensor (1; 1A) according to the fifth aspect reduces the chances of external stress being transmitted from the substrate (2; 2A) to the moving portion (6; 6A) via the surrounding portion (4; 4A), thus enabling reducing a variation in sensor characteristic.

In a physical quantity sensor (1; 1A) according to a sixth aspect, which may be implemented in conjunction with the fifth aspect, the beam portion (7; 7A) is integrated with the anchor portion (3; 3A) and the surrounding portion (4; 4A).

The physical quantity sensor (1; 1A) according to the sixth aspect contributes to simplifying its manufacturing process.

A physical quantity sensor (1; 1A) according to a seventh aspect, which may be implemented in conjunction with the sixth aspect, further includes a bonding portion (80). The bonding portion (80) is interposed between the anchor portion (3; 3A) and the substrate (2; 2A) to bond the anchor portion (3; 3A) and the substrate (2; 2A) together. Respective dimensions of the anchor portion (3; 3A), the surrounding portion (4; 4A), and the beam portion (7; 7A) are the same as each other when measured in a thickness direction (D1; D1A) defined with respect to the substrate (2; 2A).

The physical quantity sensor (1; 1A) according to the seventh aspect contributes to simplifying its manufacturing process.

In a physical quantity sensor (1; 1A) according to an eighth aspect, which may be implemented in conjunction with any one of the first to seventh aspects, the beam portion (7; 7A) has a linear shape when viewed in plan in a thickness direction (D1; D1A) defined with respect to the substrate (2; 2A).

In a physical quantity sensor (1; 1A) according to a ninth aspect, which may be implemented in conjunction with any one of the first to seventh aspects, the beam portion (7; 7A) has a bent portion (73) when viewed in plan in a thickness direction (D1; D1A) defined with respect to the substrate (2; 2A).

The physical quantity sensor (1; 1A) according to the ninth aspect increases the degree of freedom in the direction in which the beam portion (7; 7A) is elastically deformed, compared to a situation where the beam portion (7; 7A) has a linear shape.

A physical quantity sensor (1; 1A) according to a tenth aspect, which may be implemented in conjunction with any one of the first to ninth aspects, includes a plurality of beam portions (7; 7A), one of which is the beam portion (7; 7A).

The physical quantity sensor (1; 1A) according to the tenth aspect may reduce the chances of excessive stress being applied to the beam portion (7; 7A).

In a physical quantity sensor (1; 1A) according to an eleventh aspect, which may be implemented in conjunction with the tenth aspect, the plurality of beam portions (7; 7A) are arranged to have rotational symmetry around the anchor portion (3; 3A) when viewed in plan in a thickness direction (D1; D1A) defined with respect to the substrate (2; 2A).

The physical quantity sensor (1; 1A) according to the eleventh aspect increases the degree of freedom in the direction in which the beam portion (7; 7A) is elastically deformed, thus allowing relaxing the stress from the substrate (2; 2A) with more reliability.

A physical quantity sensor (1; 1A) according to a twelfth aspect, which may be implemented in conjunction with any one of the first to seventh aspects, includes a plurality of beam portions (7; 7A), one of which is the beam portion (7; 7A). At least one beam portion (7; 7A) out of the plurality of beam portions (7; 7A) has a linear shape when viewed in plan in a thickness direction (D1; D1A) defined with respect to the substrate (2; 2A).

A physical quantity sensor (1; 1A) according to a thirteenth aspect, which may be implemented in conjunction with any one of the first to seventh aspects, includes a plurality of beam portions (7; 7A), one of which is the beam portion (7; 7A). At least one beam portion (7; 7A) out of the plurality of beam portions (7; 7A) has a bent portion (73) when viewed in plan in a thickness direction (D1; D1A) defined with respect to the substrate (2; 2A).

A physical quantity sensor (1A) according to a fourteenth aspect, which may be implemented in conjunction with any one of the first to thirteenth aspects, further includes a cover (11). The cover (11) faces the substrate (2A) to cover the anchor portion (3A), the surrounding portion (4A), the moving portion (6A), and the beam portion (7A). The anchor portion (3A) is fixed to the cover (11).

The physical quantity sensor (1A) according to the fourteenth aspect allows the moving portion (6A) to be supported with more stability.

In a physical quantity sensor (1A) according to a fifteenth aspect, which may be implemented in conjunction with the fourteenth aspect, the surrounding portion (4A) is fixed to the cover (11).

The physical quantity sensor (1A) according to the fifteenth aspect allows the moving portion (6A) to be supported with more stability.

In a physical quantity sensor (1A) according to a sixteenth aspect, which may be implemented in conjunction with the fourteenth aspect, the surrounding portion (4A) is not fixed to the cover (11).

The physical quantity sensor (A) according to the sixteenth aspect reduces the chances of external stress being transmitted from the cover (11) to the moving portion (6A) via the surrounding portion (4A), thus enabling reducing a variation in sensor characteristic.

In a physical quantity sensor (1A) according to a seventeenth aspect, which may be implemented in conjunction with any one of the fourteenth to sixteenth aspects, the anchor portion (3A) has an annular recess (33) provided on a principal surface thereof facing the cover (11).

The physical quantity sensor (1A) according to the seventeenth aspect reduces the chances of external stress being transmitted from the cover (11) to the moving portion (6A) via the surrounding portion (4A), thus enabling reducing a variation in sensor characteristic.

REFERENCE SIGNS LIST 1, 1A Physical Quantity Sensor
2, 2A Substrate
21, 21A Principal Surface
3, 3A Anchor Portion
33 Recess
4, 4A Surrounding Portion
5, 5A Detecting Element
6, 6A Moving Portion
7, 7A Beam Portion
73 Bent Portion
80 Bonding Portion
81 First Bonding Portion
82 Second Bonding Portion
11 Cover
D1, D1A Thickness Direction

The invention claimed is:

1. A physical quantity sensor comprising:
a substrate;
an anchor portion formed on the same side as a principal surface of the substrate and fixed to the substrate;
a surrounding portion formed on the same side as the principal surface of the substrate and surrounding the anchor portion;
a detecting element configured to detect a physical quantity as a target of detection;
a moving portion provided with at least a part of the detecting element, formed on the same side as the principal surface of the substrate, and connected to the surrounding portion; and
a beam portion formed on the same side as the principal surface of the substrate and connecting the anchor portion and the surrounding portion together,
wherein the surrounding portion is fixed to the substrate.

2. The physical quantity sensor of claim 1, wherein the beam portion is integrated with the anchor portion and the surrounding portion.

3. The physical quantity sensor of claim 2, further comprising:
a first bonding portion interposed between the anchor portion and the substrate to bond the anchor portion and the substrate together; and
a second bonding portion interposed between the surrounding portion and the substrate to bond the surrounding portion and the substrate together, wherein
respective dimensions of the anchor portion, the surrounding portion, and the beam portion are the same as each other when measured in a thickness direction defined with respect to the substrate.

4. The physical quantity sensor of claim 1, wherein the beam portion has a linear shape when viewed in plan in a thickness direction defined with respect to the substrate.

5. The physical quantity sensor of claim 1, wherein the beam portion has a bent portion when viewed in plan in a thickness direction defined with respect to the substrate.

6. The physical quantity sensor of claim 1, comprising a plurality of beam portions, one of which is the beam portion.

7. The physical quantity sensor of claim 6, wherein the plurality of beam portions are arranged to have rotational symmetry around the anchor portion when viewed in plan in a thickness direction defined with respect to the substrate.

8. The physical quantity sensor of claim 1, comprising a plurality of beam portions, one of which is the beam portion, wherein
at least one beam portion out of the plurality of beam portions has a linear shape when viewed in plan in a thickness direction defined with respect to the substrate.

9. The physical quantity sensor of claim 1, comprising a plurality of beam portions, one of which is the beam portion, wherein
at least one beam portion out of the plurality of beam portions has a bent portion when viewed in plan in a thickness direction defined with respect to the substrate.

10. The physical quantity sensor of claim 1, further comprising a cover facing the substrate to cover the anchor portion, the surrounding portion, the moving portion, and the beam portion, wherein
the surrounding portion is fixed to the cover.

11. The physical quantity sensor of claim 1, further comprising a cover facing the substrate to cover the anchor portion, the surrounding portion, the moving portion, and the beam portion, wherein
the surrounding portion is not fixed to the cover.

12. A physical quantity sensor comprising:
a substrate;
an anchor portion formed on the same side as a principal surface of the substrate and fixed to the substrate;
a surrounding portion formed on the same side as the principal surface of the substrate and surrounding the anchor portion;
a detecting element configured to detect a physical quantity as a target of detection;
a moving portion provided with at least a part of the detecting element, formed on the same side as the principal surface of the substrate, and connected to the surrounding portion;
a beam portion formed on the same side as the principal surface of the substrate and connecting the anchor portion and the surrounding portion together; and
a cover facing the substrate to cover the anchor portion, the surrounding portion, the moving portion, and the beam portion, wherein
the anchor portion is fixed to the cover, and
the surrounding portion is fixed to the cover.

13. The physical quantity sensor of claim 12, wherein the anchor portion has an annular recess provided on a principal surface thereof facing the cover.

* * * * *